US012713551B2

(12) United States Patent
James et al.

(10) Patent No.: US 12,713,551 B2
(45) Date of Patent: Aug. 18, 2026

(54) L-SHAPED CABLE CARTRIDGE

(71) Applicant: Advanced Micro Devices, Inc., Santa Clara, CA (US)

(72) Inventors: Norman James, Austin, TX (US); Steven Lee Scott, Bellevue, WA (US); Wade Doll, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 214 days.

(21) Appl. No.: 18/751,174

(22) Filed: Jun. 21, 2024

(65) Prior Publication Data

US 2025/0338425 A1 Oct. 30, 2025

Related U.S. Application Data

(60) Provisional application No. 63/638,272, filed on Apr. 24, 2024.

(51) Int. Cl.
*H05K 7/20* (2006.01)
*H05K 7/14* (2006.01)

(52) U.S. Cl.
CPC .................................. *H05K 7/1489* (2013.01)

(58) Field of Classification Search
CPC .. H05K 7/1488; H05K 7/1489; H05K 7/1452; H05K 7/1459; H05K 7/1461; H04Q 1/06; H04Q 1/062; H04Q 1/064; H04Q 1/068; H04Q 1/08; H04Q 1/09
See application file for complete search history.

(56) References Cited

U.S. PATENT DOCUMENTS

2003/0223199 A1* 12/2003 Smith ..................... G06F 1/181 312/223.1
2009/0238533 A1* 9/2009 Stansbury ................ H04Q 1/10 385/135
2014/0036542 A1 2/2014 Kang et al.
2016/0360648 A1* 12/2016 Brehin ................. H05K 7/1424
2019/0124422 A1 4/2019 Diaz et al.
2020/0163242 A1 5/2020 Leigh et al.
2023/0042543 A1* 2/2023 Rathinasamy ....... H05K 7/1489

FOREIGN PATENT DOCUMENTS

JP 2019032582 A 2/2019
KR 20060090771 A 8/2006

OTHER PUBLICATIONS

International Search Report and Written Opinion for PCT/US2025/019851 dated Jul. 2, 2025.

* cited by examiner

*Primary Examiner* — Anthony Q Edwards
(74) *Attorney, Agent, or Firm* — Patterson + Sheridan, LLP

(57) ABSTRACT

A rack is provided. In one aspect, a rack includes a horizontal tray, a vertical tray, and an L-shaped cable cartridge. The L-shaped cable cartridge includes connectors configured to connect to horizontal tray connectors on a first side of the horizontal tray and to vertical tray connectors on a second side of the vertical tray that is orthogonal to the first side. Further, the L-shaped cable cartridge includes cables connected to the connectors in the L-shaped cable cartridge to facilitate communication between the horizontal and vertical trays.

20 Claims, 10 Drawing Sheets

600
606
612
612
612
684
608
682
676
680
672
674
678
670
664
614
614
660
662
614
604
X 600
606
612
612
612
684
608
676
670
614
660
662
674
672
D8
604
658
X 600
606
612
612
612
684
682
608
676
670
D9
614
662
660
674
672
D8
604
X

L-SHAPED CABLE CARTRIDGE

CROSS-REFERENCE TO RELATED APPLICATIONS

This application claims priority to the U.S. Provisional Patent Application Ser. No. 63/638,272 filed Apr. 24, 2024 of which is incorporated herein by reference in its entirety.

BACKGROUND

A rack (or cabinet) is a structure often used in data centers to hold trays of computing elements in a vertical stack. Typically, the trays are connected to each other on the rear (or back) side of the rack. That is, cables can be connected at the back sides of the trays in order to communicatively couple the compute elements in the trays to each other.

However, as the density of trays and compute elements increases in the rack, the area at the rear of the rack for routing cables has become limited, making it increasing difficult to provide sufficient beachfront for the necessary cable connections. Compounding the problem is that the rear side of the trays is also often used for cooling the trays by including fans or vents. As the density of electrical connections increases at the rear side, this leaves less room for cooling equipment.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
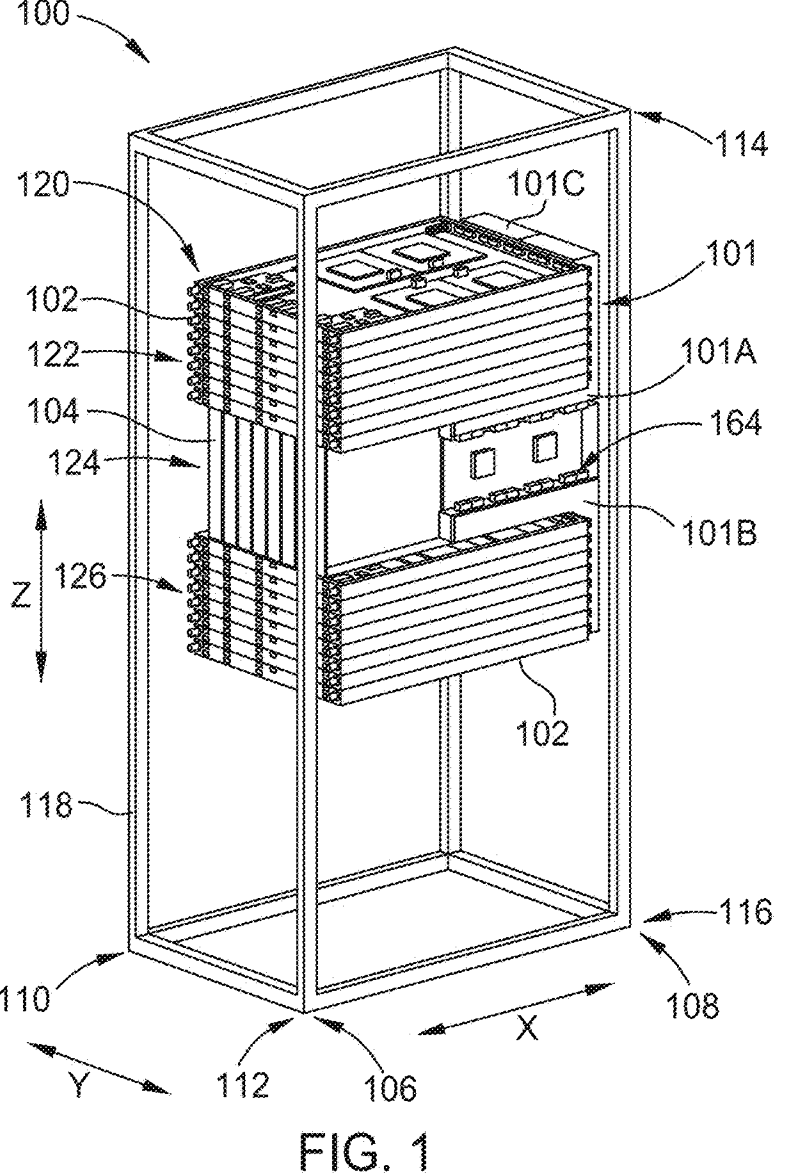
FIGS. 1 and 2 illustrate various views of a rack according to an example embodiment of the present disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

A rack can hold a plurality of vertically-stacked trays with compute elements. Conventionally, such trays have been connected to each other on the rear side or back of the rack. Particularly, traditionally cables have been connected at the rear sides of the trays in order to provide communication between the compute elements in the trays to each other and/or to switch elements. But as noted above, as the density of trays and compute elements increases in the rack, the area at the rear of the rack for routing cables has become limited, making it increasing difficult to provide sufficient area or "beachfront" for cable connections. Compounding the problem is that the rear side of the trays is also often used for cooling the trays by including fans or vents. As the density of electrical connections increases at the rear side, this leaves less room for cooling equipment and other items.

Accordingly, a rack that includes features for addressing one or more of these noted challenges is described herein. In one example aspect, a rack is disclosed. The rack can include a plurality of horizontal trays that can be mounted in the rack in a first orientation, e.g., a horizontal orientation. The horizontal trays can each include electrical connectors at their respective rear sides. The rack can also include a plurality of vertical trays that can be mounted in the rack in a second orientation, e.g., a vertical orientation. The vertical trays can each include electrical connectors at their respective top and/or bottom sides. The rack can further include an L-shaped cable cartridge. The L-shaped cable cartridge has a vertically-oriented portion and a horizontally-oriented portion that collectively form an L-shape. A first side of the L-shaped cable cartridge can include a first set of electrical connectors (e.g., backplane connectors) and a second side of the L-shaped cable cartridge can include a second set of electrical connectors (e.g., cammed connectors), with the second side being orthogonal to the first side. The first side can form a part of the vertically-oriented portion and the second side can form a part of the horizontally-oriented portion of the L-shaped cable cartridge. The first set of electrical connectors are configured to mate with the electrical connectors of the horizontal trays while the second set of connectors are configured to mate with the electrical connectors of the vertical trays. In at least some embodiments, once aligned, the second set of connectors can be moved or actuated to mate with the electrical connectors of the vertical trays. Cables disposed within the L-shaped cable cartridge can connect the connectors in the L-shaped cable cartridge to facilitate communication between the horizontal and vertical trays. For instance, each cable can couple one of the electrical connectors of the first set with one of the electrical connectors of the second set so as to provide communication between one of the horizontal trays and one of the vertical trays. In some embodiments, the rack can include multiple L-shaped cable cartridges.

The rack of the present disclosure can provide one or more advantages, benefits, and/or technical effects. For instance, a rack of the present disclosure utilizing one or more L-shaped cable cartridges and trays of different orientations can allow the rear side of the rack to be used for uses or than just cable connections, such as for airflow (e.g., fans or vents), manifolds, power connectors, and/or other elements. Stated another way, additional "beachfront" can be provided. Moreover, compared to conventional designs, flyover cables within the trays (especially the vertical trays) can be made shorter due to the close proximity of the connectors to the elements of the tray (e.g., to the switch elements), which may permit the trays to be interconnected using passive differential pair cables, instead of active (powered) wire cables or optical cables.

In another example aspect, different actuation techniques for coupling connectors of a tray to connectors in an L-shaped cable cartridge are disclosed. In some embodiments, one set of connectors can be moved or actuated while the other set of connectors can be fixed. The movable connectors can be on the tray while the fixed connectors can be in the L-shaped cable cartridge, or vice versa. In some embodiments, both sets of connectors can be moved or actuated. In some aspects, the set of actuated connectors can be actuated individually to mate with corresponding fixed connectors, much like a zipper. This can be advantageous since less force can be applied to the actuated connectors when mating, relative to a technique that mates the connectors on at the same time (i.e., in parallel). In other aspects, the set of actuated connectors can be actuated in parallel, or rather, at the same time. This can provide efficiency in mating the connectors, among other benefits. Further, actuation of the connectors can be done manually, e.g., with a spear having a pointed tip, or automatically with an automated mechanism, e.g., a motor-driven lever that moves a bar to ultimately actuate the actuated connectors.

In one aspect, a rack is provided. The rack includes a horizontal tray; a vertical tray; and an L-shaped cable cartridge. The L-shaped cable cartridge includes: (i) connectors configured to connect to horizontal tray connectors on a first side of the horizontal tray and vertical tray connectors on a second side of the vertical tray that is orthogonal to the first side; and (ii) cables connected to the connectors in the L-shaped cable cartridge to facilitate communication between the horizontal tray and the vertical tray.

In another aspect, an L-shaped cable cartridge is provided. The L-shaped cable cartridge includes connectors configured to connect to horizontal tray connectors on a first side of a horizontal tray and to connect to vertical tray connectors on a second side of a vertical tray that is orthogonal to the first side. The L-shaped cable cartridge also includes cables connected to the connectors in the L-shaped cable cartridge to facilitate communication between the horizontal tray and the vertical tray.

In a further aspect, a method is provided. The method includes mounting an L-shaped cable cartridge in a rack; mounting a horizontal tray in the rack to mate horizontal tray connectors in the horizontal tray with connectors in the L-shaped cable cartridge of a first side of the L-shaped cable cartridge; and mounting a vertical tray in the rack to mate vertical tray connectors in the vertical tray with connectors in a second side of the L-shaped cable cartridge, with the second side being orthogonal to the first side.

L-Shaped Cable Cartridges

Figure 2:
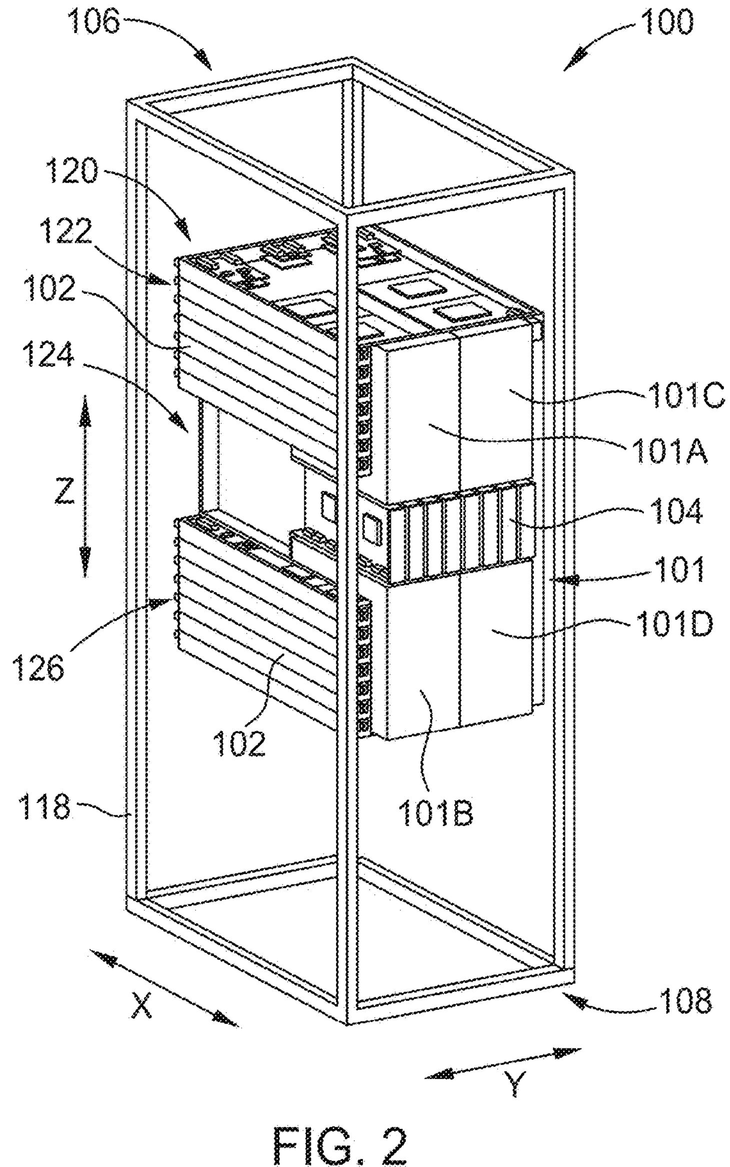

FIGS. 1 and 2 illustrate various views of a rack 100 according to various embodiments of the present disclosure. For reference, the rack 100 defines a first direction X, a second direction Y, and a third direction Z, which are mutually perpendicular to one another and form an orthogonal direction system. The first direction X can be a transverse direction, the second direction Y can be a lateral direction, and the third direction Z can be a vertical direction, for example. The rack 100 has a front side 106, a rear side 108, a first side 110, and a second side 112. The front side 106 is spaced from the rear side 108, e.g., along the first direction X. The first side 110 is spaced from the second side 112, e.g., along the second direction Y. The rack 100 also has a top 114 and a bottom 116, which are spaced from one another along the third direction Z.

The rack 100 includes a frame 118 supporting a plurality of trays 120, including horizontal trays 102 and vertical trays 104. The horizontal trays 102 and the vertical trays 104 are connected using one or more L-shaped cable cartridges 101. In the depicted embodiment of FIGS. 1 and 2, the rack 100 includes four (4) L-shaped cable cartridges, including first, second, third, and fourth L-shaped cable cartridges 101A, 101B, 101C, and 101D (collectively L-shaped cable cartridges 101). The horizontal trays 102 are stacked vertically or on top of each other when slid into the rack 100 while the vertical trays 104 are disposed side-by-side when slid into the rack 100.

In some embodiments, the horizontal trays 102 are compute trays that contain processing elements while the vertical trays 104 are switching trays that contain switching elements. For example, the horizontal trays 102 can include one or more data processing elements, such as central processing units (CPUs), application specific integrated circuits (ASIC), field programmable gate array (FPGA), or parallel processors (e.g., graphic processing units (GPUs), tensor processors, data processing units (DPUs), and the like). The vertical trays 104 can include one or more switch elements, such as network switch integrated circuits. The horizontal trays 102 and the vertical trays 104 can be collectively referred to herein as trays 120.

In some embodiments, the horizontal trays 102 (or compute trays) include the same compute components (e.g., a tray containing multiple GPUs). In another embodiment, the compute trays include a mixture of compute components (e.g., a tray containing GPUs and FPGAs). For ease of explanation, the remaining discussion assumes that the horizontal trays 102 include multiple GPUs (e.g., a GPU tray), however, this is just one example and is not intended to be limiting.

In at least some embodiments, the trays 120 can be clustered within the rack 100. For instance, for the rack 100 of FIGS. 1 and 2, the rack 100 includes a first plurality of horizontal trays, a second plurality of horizontal trays, and a plurality of vertical trays disposed between the first and second plurality of horizontal trays. The first plurality of horizontal trays (or first set 122 of horizontal trays 102) is disposed above the plurality of vertical trays (or set 124 of vertical trays 104), while the second plurality of horizontal trays (or second set 126 of horizontal trays 102) is disposed below the plurality of vertical trays, e.g., along the third direction Z, which as noted above, can be a vertical direction. Accordingly, the first plurality of horizontal trays is arranged on a different side of the plurality of vertical trays than the second plurality of horizontal trays. The plurality of vertical trays are stacked on the second plurality of horizontal trays while the first plurality of horizontal trays are stacked on the plurality of vertical trays. Each cluster of trays of the rack 100 can include a same number of trays or the clusters can have different numbers of trays. In this example embodiment, each cluster includes eight (8) trays.

Figure 3:
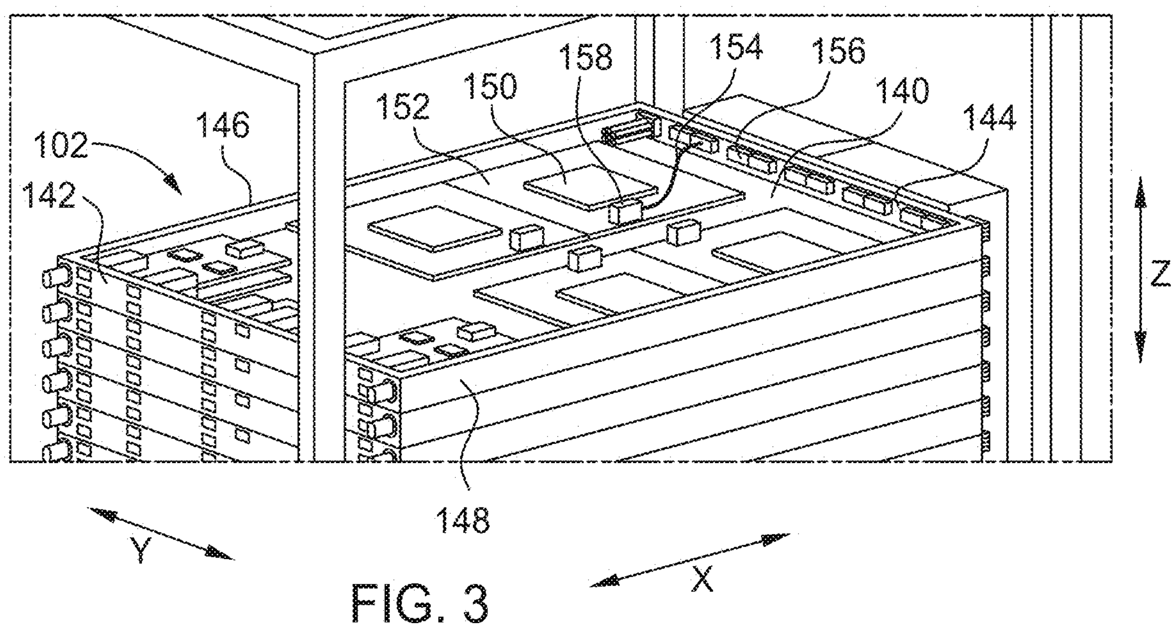
FIG. 3 illustrates a horizontal tray of the rack of FIGS. 1 and 2.

With reference now to FIG. 3, one of the horizontal trays 102 of the rack 100 of FIGS. 1 and 2 will be described in further detail. As depicted, the horizontal tray 102 has a tray base 140 and a plurality of walls extending from the tray base 140, e.g., along the third direction Z. The tray base 140 extends in a plane orthogonal to the third direction Z. The walls include a front wall 142, a rear wall 144, a first sidewall 146, and a second sidewall 148. The tray base 140 and the walls 142, 144, 146, 148 define a tray volume in which various components are arranged, such as compute elements 150.

The compute elements 150 in the horizontal tray 102 can be mounted on substrates 152 (e.g., printed circuit boards (PCBs)). The compute elements 150 can be CPUs, ASICs, FPGAs, or parallel processors (e.g., GPUs, tensor processors, DPUs, and the like), for example. Flyover cables 154 (only one shown in FIG. 3), which can be passive differential pair (DP) wire cables, can connect the compute elements 150 to horizontal tray connectors 156. Specifically, the flyover cables 154 can connect the horizontal tray connectors 156 with board connectors 158, which are in turn connected to their respective compute elements 150. The horizontal tray connectors 156 can be arranged in the rear wall 144 of the horizontal tray 102. The horizontal tray connectors 156 can be mated with backplane connectors of the L-shaped cable cartridges 101, as will be explained further below.

Figure 4:
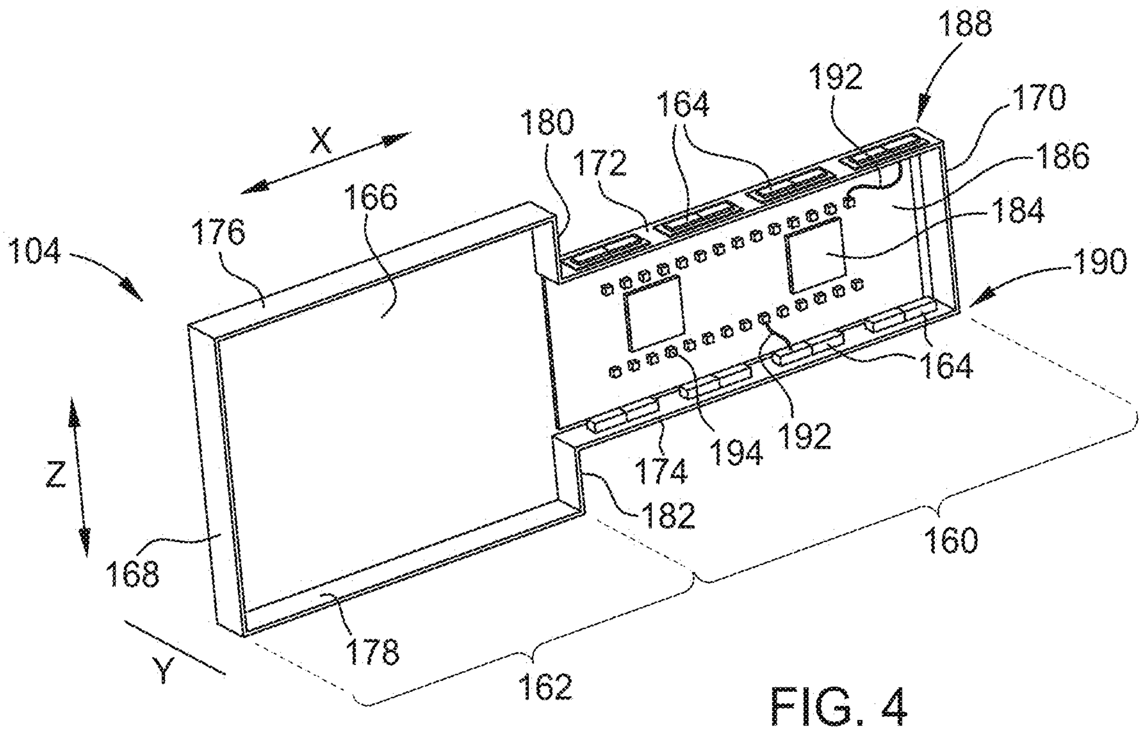
FIG. 4 illustrates a vertical tray of the rack of FIGS. 1 and 2.

With reference now to FIG. 4, one of the vertical trays 104 of the rack 100 of FIGS. 1 and 2 will be described in further detail. As shown, the vertical tray 104 has a first section 160 and a second section 162, or rather, a rear section and a forward section. The first section 160 has a smaller height than does the second section 162. The smaller height of the first section 160 can provide a space for the L-shaped cable cartridge(s) 101 (FIGS. 1, 2) to be fit or arranged relative to the vertical trays 104, e.g., so that vertical tray connectors 164 in the second section 162 can mate with cammed connectors 121 (FIG. 6) of one or more of the L-shaped cable cartridges 101.

The vertical tray 104 has a tray base 166 and a plurality of walls extending from the tray base 166, e.g., along the second direction Y. The tray base 166 extends in a plane orthogonal to the second direction Y. The walls include a front wall 168, a rear wall 170, a first top wall 172, a first bottom wall 174, a second top wall 176, a second bottom wall 178, a first interconnecting wall 180, and a second interconnecting wall 182. The tray base 166 and the walls 168, 170, 172, 174, 176, 178, 180, 182 define a tray volume in which various components are arranged, such as switch elements 184. The switch elements 184 can be network switch integrated circuits, for example. The switch elements 184 can be mounted on a PCB 186. The vertical tray connectors 164 of a first set 188 (or top set) are arranged in the first top wall 172 and the vertical tray connectors 164 of a second set 190 (or bottom set) are arranged in the first bottom wall 174, which is opposite the first top wall 172. In some embodiments, cammed connectors of one L-shaped cable cartridge can mate with the vertical tray connectors 164 of the first set 188 and cammed connectors of another L-shaped cable cartridge can mate with the vertical tray connectors 164 of the second set 190.

Further, in some embodiments, such as in the embodiment of FIG. 4, the first section 160 is centered with the second section 162, e.g., along the third direction Z. That is, the first interconnecting wall 180 and the second interconnecting wall 182 can have the same length along the third direction Z. In this way, L-shaped cable cartridges having a same form factor can be coupled with the vertical trays 104 above or below the first section 160.

Flyover cables 192 (only two shown in FIG. 4), which can be passive differential pair (DP) wire cables, can connect the switch elements 184 to the vertical tray connectors 164. Specifically, the flyover cables 192 can connect the vertical tray connectors 164 with board connectors 194, which are in turn connected to their respective switch elements 184. As noted above, the vertical tray connectors 164 of the can be mated with cammed connectors of L-shaped cable cartridges.

Figure 5:
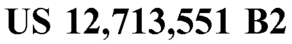
FIG. 5 illustrates an L-shaped cable cartridge of the rack of FIGS. 1 and 2.
Figure 5:
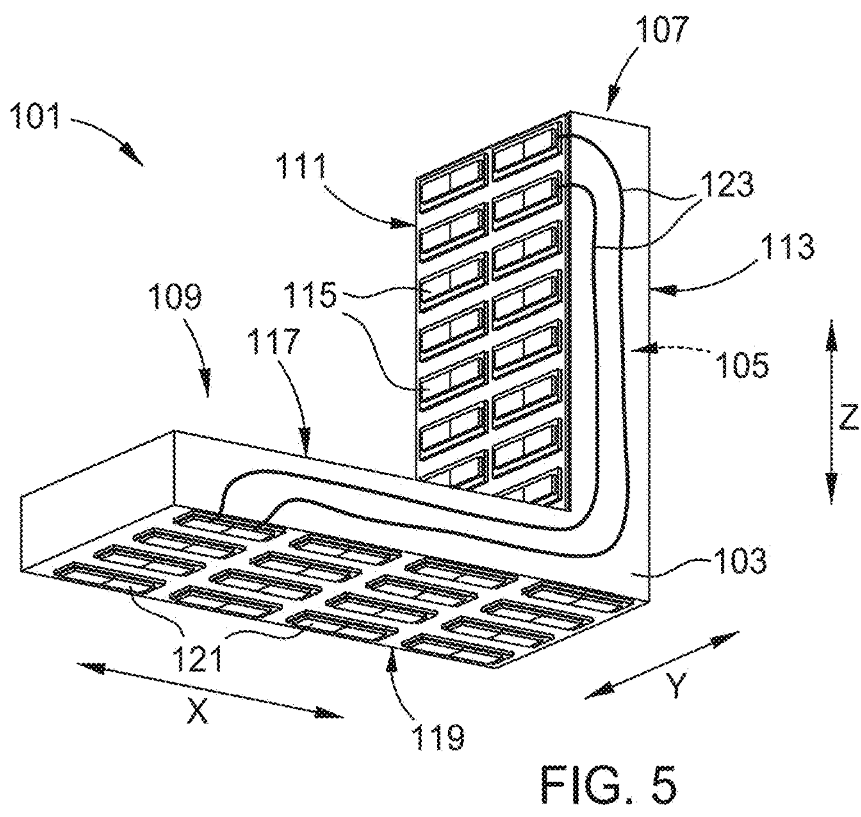
Figure 6:
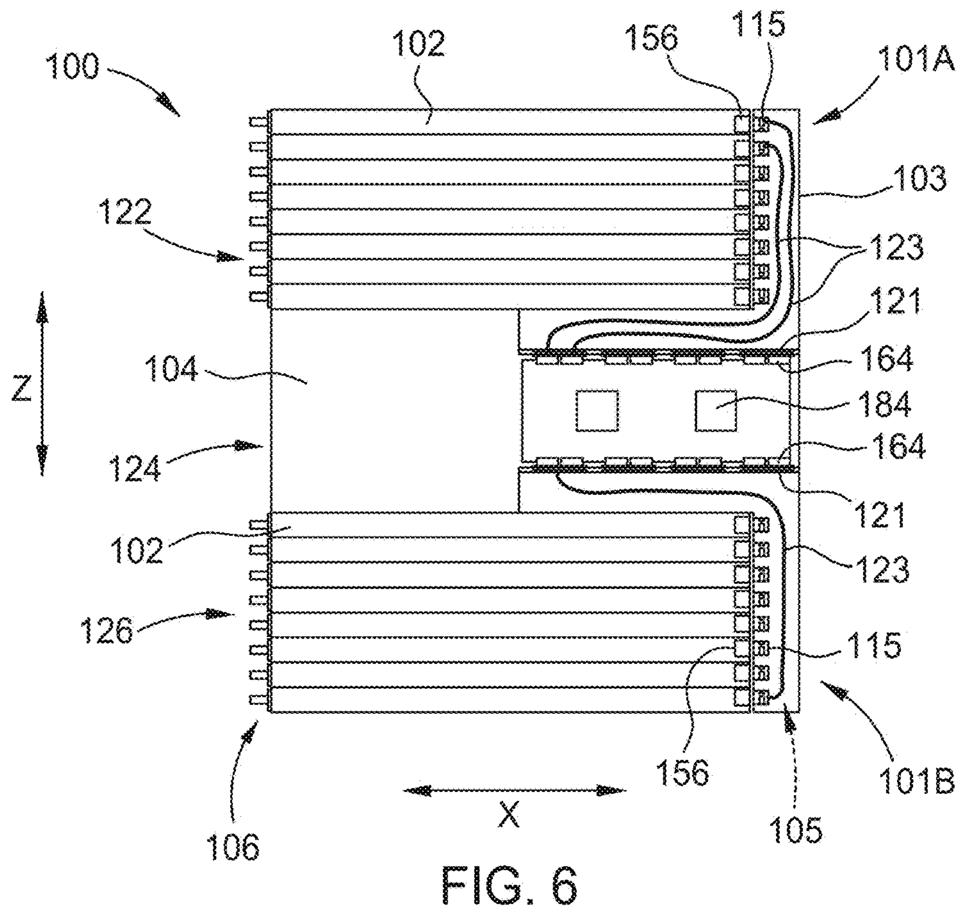
FIG. 6 illustrates the L-shaped cable cartridge coupling the horizontal trays and the vertical trays of the rack of FIGS. 1 and 2.

With reference now to FIGS. 5 and 6, FIG. 5 illustrates a perspective view of one of the L-shaped cable cartridges 101 while FIG. 6 depicts a side view of the rack 100 of FIGS. 1 and 2, with the first and second L-shaped cable cartridges 101A, 101B depicted coupling the horizontal trays 102 with the vertical trays 104. Some components (e.g., the frame 118; FIG. 1) of the rack 100 have been removed in FIG. 6 for illustrative purposes.

As shown in FIG. 5, the L-shaped cable cartridge 101 has a housing 103 having an L-shaped construction. The housing 103 can be bolted to the frame 118 (FIG. 1) of the rack 100, for example. The housing 103 defines an interior volume 105. The housing 103 has a first portion 107 (or vertically-oriented portion) and a second portion 109 (or horizontally-oriented portion) arranged substantially orthogonal to one another, e.g., the first portion 107 can be arranged at a ninety degree (90°) angle relative to the second portion 109, or within ten degrees (10°) of ninety degrees (90°).

The first portion 107 has an internal side 111 and an external side 113 opposing the internal side 111. The internal side 111 generally faces toward the front side 106 of the rack 100, or when the horizontal trays 102 are slid into the rack 100, the internal side 111 faces the rear walls 144 (FIG. 3) of the horizontal trays 102. The external side 113 faces away from the front side 106 of the rack 100. The internal side 111 of the first portion 107 of the L-shaped cable cartridge 101 has a plurality of backplane connectors 115 configured to respectively connect to horizontal tray connectors 156 of one or more of the horizontal trays 102. For instance, in FIG. 6, the backplane connectors 115 of the first L-shaped cable cartridge 101A are shown connected or mated to the horizontal tray connectors 156 of the horizontal trays 102 of the first set 122. Also, the backplane connectors 115 of the second L-shaped cable cartridge 101B are depicted connected or mated to the horizontal tray connectors 156 of the horizontal trays 102 of the second set 126.

The backplane connectors 115 of the L-shaped cable cartridge 101 can be arranged in an array of rows and columns as shown in FIG. 5. In some embodiments, a number of rows of backplane connectors 115 of the L-shaped cable cartridge 101 can correspond to a number of horizontal trays in a corresponding set of horizontal trays. For instance, the L-shaped cable cartridge 101 can have eight (8) rows of backplane connectors 115 where there is eight (8) horizontal trays in a corresponding set of horizontal trays 102. In some embodiments, a number of columns of backplane connectors 115 of the L-shaped cable cartridge 101 can correspond to a number of columns of horizontal tray connectors 156 of the horizontal trays 102. In other embodiments, a number of columns of backplane connectors 115 of the L-shaped cable cartridge 101 can correspond to half a number of columns of horizontal tray connectors 156 of the horizontal trays 102. In this regard, multiple L-shaped cable cartridges can be arranged to couple to a given set of horizontal trays 102. For instance, in FIGS. 1 and 2, the first and third L-shaped cable cartridges 101A, 101C are coupled with the first set 122 of horizontal trays 102 while the second and fourth L-shaped cable cartridges 101B, 101D are coupled with the second set 126 of horizontal trays 102.

The second portion 109 has a tray-interface side 117 and a connector-interface side 119 opposing the tray-interface side 117. A face of the tray-interface side 117 is adjacent to a face of the internal side 111, or stated differently, the face of the tray-interface side 117 and the face of the internal side 111 meet at an edge, while the face of the internal side 111 and a face of the connector-interface side 119 do not. Further, depending on the orientation of the L-shaped cable cartridge within a rack, the tray-interface side 117 can be seated on one of the horizontal trays 102 or one of the horizontal trays 102 can be seated on the tray-interface side 117. For instance, in FIG. 6, the tray-interface side 117 of the second L-shaped cable cartridge 101B is shown seated on a topmost horizontal tray of the second set 126. In contrast, in FIG. 6, a bottommost horizontal tray of the first set 122 is seated on the tray-interface side 117 of the first L-shaped cable cartridge 101A. Accordingly, when an L-shaped cable cartridge is right-side up, such as the first L-shaped cable cartridge 101A in FIG. 6, one of the horizontal trays 102 is seated on the tray-interface side 117, and when an L-shaped cable cartridge is inverted, such as the second L-shaped cable cartridge 101B in FIG. 6, the tray-interface side 117 is seated on one of the horizontal trays 102.

The connector-interface side 119 of the second portion 109 of the L-shaped cable cartridge 101 has a plurality of cammed connectors 121 configured to respectively connect to vertical tray connectors 164 of one or more of the vertical trays 104. For instance, in FIG. 6, the cammed connectors 121 of the first L-shaped cable cartridge 101A are shown connected or mated to the vertical tray connectors 164 of the vertical trays 104, or more specifically, to the vertical tray connectors 164 of the top or first set 188 (FIG. 4). Also, in FIG. 6, the cammed connectors 121 of the second L-shaped cable cartridge 101B are shown connected or mated to the vertical tray connectors 164 of the vertical trays 104, or more specifically, to the vertical tray connectors 164 of the bottom or second set 190 (FIG. 4). In some embodiments, the cammed connectors 121 can be moved or actuated (e.g., along the third direction Z) to mate with their respective vertical tray connectors 164. Example actuation techniques for actuating the cammed connectors 121 are discussed later in the present disclosure.

Accordingly, the backplane connectors 115 of the L-shaped cable cartridge 101 are configured to connect to at least some of the horizontal tray connectors 156 arranged on respective first sides of the horizontal trays 102 (e.g., at the respective rear walls 144 of the horizontal trays 102) and the cammed connectors 121 of the L-shaped cable cartridge 101 are configured to connect to at least some of the vertical tray connectors 164 arranged on respective second sides of the vertical trays 104 (e.g., at the respective top walls 172 or bottom walls 174 of the vertical trays 104, depending on the orientation and placement of the L-shaped cable cartridge 101 in the rack 100), with the respective second sides being orthogonal to the respective first sides. Stated differently, the rear walls 144 of the horizontal trays 102 are orthogonal to both the top walls 172 and the bottom walls 174 of the vertical trays 104, and consequently, the backplane connectors 115 mate with the horizontal tray connectors 156 in a horizontal mating orientation while the cammed connectors 121 mate with the vertical tray connectors 164 in a vertical mating orientation. Thus, the backplane connectors 115 and the horizontal tray connectors 156 are arranged side-by-side when mated and the cammed connectors 121 and the vertical tray connectors 164 are arranged in a vertically-stacked arrangement when mated.

As further shown in FIG. 5, the L-shaped cable cartridge 101 includes cables 123 (only two (2) shown in FIG. 5). The cables 123 are disposed within the interior volume defined by the housing 103 and can travel through the first portion 107 and the second portion 109. The cables 123 can connect the connectors in the L-shaped cable cartridge 101 to facilitate communication between the horizontal and vertical trays 102, 104. In at least some embodiments, each one of the cables 123 in the L-shaped cable cartridge 101 can connect a pair of the connectors of the L-shaped cable cartridge 101. For instance, each one of the cables 123 can connect one of the backplane connectors 115 with one of the cammed connectors 121. In this way, with the backplane connectors 115 mated with respective ones of the horizontal tray connectors 156 and the cammed connectors 121 mated with respective ones of the vertical tray connectors 164, the cables 123 of the L-shaped cable cartridge 101 can facilitate communication between the horizontal and vertical trays 102, 104. In FIG. 6, the cables 123 of the first L-shaped cable cartridge 101A facilitate communication between the horizontal trays 102 of the first set 122 and the vertical trays 104 while the cables 123 of the second L-shaped cable cartridge 101B facilitate communication between the horizontal trays 102 of the second set 126 and the vertical trays 104.

With reference again to FIGS. 1, 2, 5 and 6, in some embodiments, the horizontal trays 102 are compute trays while the vertical trays 104 are switch trays, and in such embodiments, the switch trays are connected to the compute trays to form a high-speed network in the rack 100. Put differently, the vertically-oriented switch trays can form an internal network in the rack 100 so that each horizontally-oriented compute tray can communicate with multiple other compute trays via the switch trays. In some embodiments, the switch trays interconnect the compute trays so that every horizontal compute tray can communicate with every other horizontal compute tray. This may be especially advantageous when the compute trays are tasked with performing a high compute task, such as an artificial intelligence or machine learning task.

As discussed above, a rear side 108 of the rack 100 may not have sufficient area for attaching cables from the compute trays to the switch trays (or horizontal trays 102 to the vertical trays 104). For example, the rear sides of the trays are also often used for cooling the trays by including fans or vents. As the density of connections increase at the rear side, this leaves less room for cooling equipment and/or other items.

To decrease the amount of "beachfront" used on the rear side of a tray for electrical connectors, in accordance with embodiments presented herein, the cables 123 used to couple the horizontal trays 102 to the vertical trays 104 are placed in the L-shaped cable cartridges 101. In the example embodiment of FIGS. 1 and 2, the rack 100 includes the first and third L-shaped cable cartridge 101A, 101C that connect the vertical trays 104 to the horizontal trays 102 above the vertical trays 104 (or to the first set 122 of the horizontal trays 102) and the second and fourth cable cartridges 101B, 101D that connect the vertical trays 104 to the horizontal trays 102 below the vertical trays 104 (or to the second set 126 of the horizontal trays 102). In some embodiments, a single L-shaped cable cartridge can connect the vertical trays 104 to the horizontal trays 102 disposed above the vertical trays 104 and/or a single L-shaped cable cartridge can connect the vertical trays 104 to the horizontal trays 102 disposed below the vertical trays 104.

The cables 123 contained within the L-shaped cable cartridges 101 can couple the compute trays to the switch trays, or rather, the horizontal trays 102 to the vertical trays 104, thereby permitting the horizontal trays 102 to communicate with vertical trays 104. Each one of the cables 123 in an L-shaped cable cartridge can connect to a pair of the connectors in that L-shaped cable cartridge, where these connectors in turn mate with respective tray connectors, e.g., with one connector of the pair mating with a connector of a compute tray and the other connector of the pair mating with a connector of a switch tray. In some embodiments, at least one of the L-shaped cable cartridges 101 can include one cable for every pair of its connectors. While only a few cables 123 are shown in FIGS. 5 and 6, it will be appreciated that many cables can be arranged within the L-shaped cable cartridges 101, e.g., so that each pair of connectors of a given L-shaped cable cartridge has an associated cable connecting them.

In some embodiments, every compute tray is connected to every one of the switch trays where the cables are contained within the L-shaped cable cartridges 101. Although not shown, the horizontal trays 102 and the vertical trays 104 can be connected to other compute elements (not in the rack 100), e.g., using the side opposite from the side connected to the L-shaped cable cartridges 101. Further, while FIGS. 1 and 2 illustrate using the rear side 108 to route at least some of the cables interconnecting the horizontal trays 102 and the vertical trays 104, in other embodiments some of the cables interconnecting these trays may be disposed at the sides of the rack 100 that are orthogonal to the rear/front sides 108, 106.

In any case, FIGS. 1 and 2 illustrate that by using the L-shaped cable cartridges 101, additional space at the rear side of the vertical trays 104 can be used for components other than electrical connectors. That is, there may not be sufficient room at the rear side of the vertical trays 104 for the desired number of connectors to connect to the horizontal trays 102, but, by using the L-shaped cable cartridges 101, the bottom and tops of the vertical trays 104 can be used for electrical connectors instead of the rear side of the vertical trays 104. Also, doing so may shorten the length of the flyover cables 192 (FIG. 4) in the vertical trays 104 and in the L-shaped cable cartridges 101, which may permit the horizontal and vertical trays 102, 104 to be interconnected using passive wire DP cables, instead of active wire cables, or optical cables.

In some embodiments, to connect the L-shaped cable cartridges 101 to the horizontal and vertical trays 102, 104, the L-shaped cable cartridges 101 are first mounted in the rack 100, e.g., slid into the rack 100 or positioned in place and bolted to the frame 118. Then, the horizontal trays 102 (e.g., compute trays) are slid into the rack 100 so that the horizontal tray connectors 156 mate with the backplane connectors 115 of the L-shaped cable cartridges 101. In one example, the backplane connectors 115 are not actuated when being mated with the horizontal tray connectors 156 in the horizontal trays 102. The vertical trays 104 are then slid into the rack 100 so that the cammed connectors 121 of the L-shaped cable cartridges 101 are aligned with the vertical tray connectors 164, e.g., along the first direction X. Next, the cammed connectors 121 can be actuated to mate with the vertical tray connectors 164. For instance, the cammed connectors 121 can be actuated to move along the third direction Z to mate with the vertical tray connectors 164. The cammed connectors 121 can be actuated according to any of the techniques disclosed further below. In some embodiments, when the vertical trays 104 are slid into the rack 100, the cammed connectors 121 of the L-shaped cable cartridges 101 can be fixed connectors and the vertical tray connectors 164 can be actuated, e.g., to move along the third direction Z to mate with the cammed connectors 121.

In addition to using the arrangement of the rack 100 in FIGS. 1 and 2 to connect compute and switch trays, in other embodiments, the L-shaped cable cartridges 101 discussed above can apply to a rack that includes trays of the same type (e.g., compute trays that are interconnected to each other, where some are vertical and others are horizontal). Further, the rack 100 can include more than two types of trays. For example, the rack 100 could include the compute trays, switch trays, and data storage trays which are also connected to the switch trays to provide local (rack level) storage for the compute trays.

Figure 7:
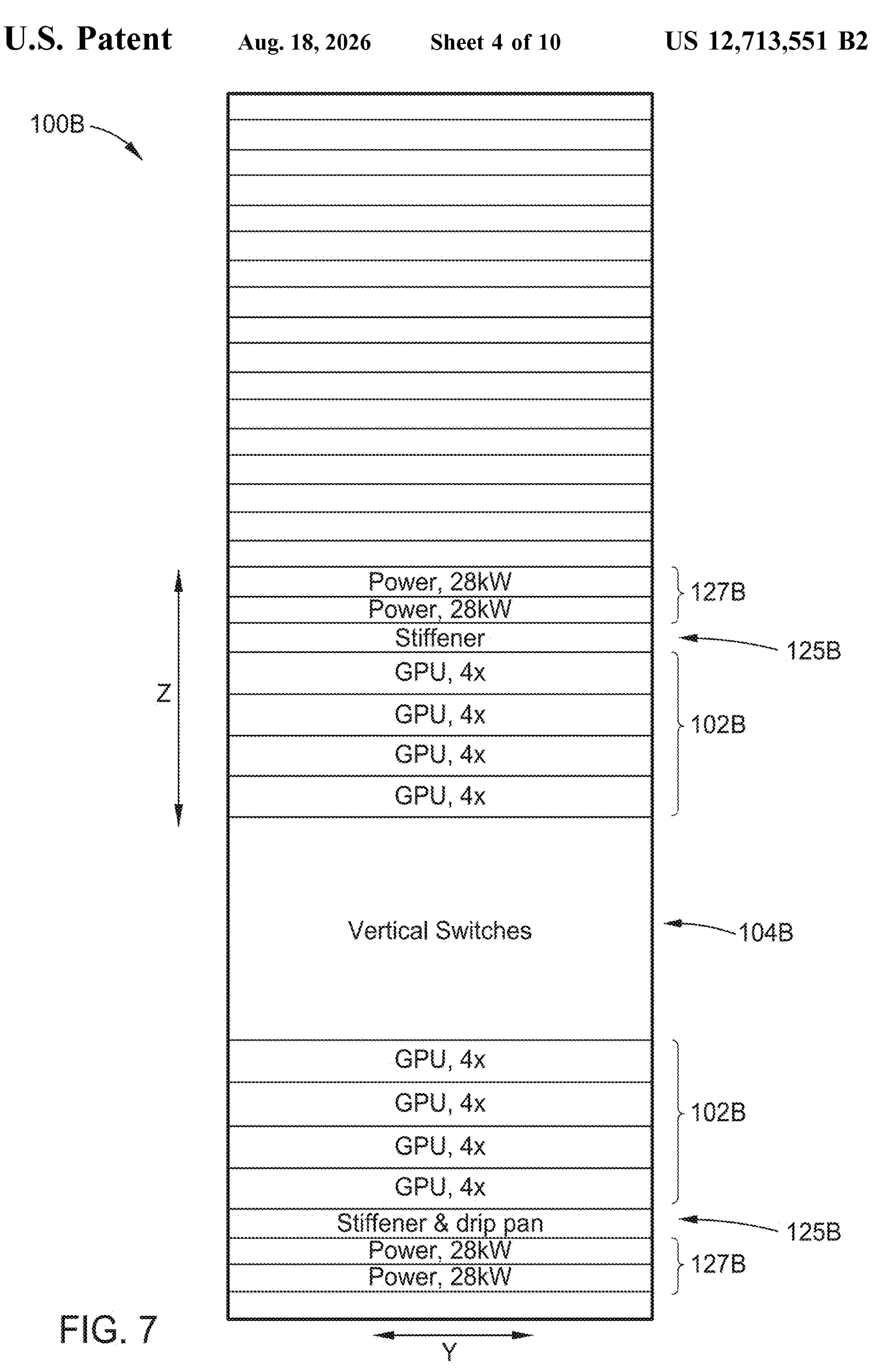
FIGS. 7 and 8 illustrate various implementations of the rack of FIGS. 1 and 2.
Figure 8:
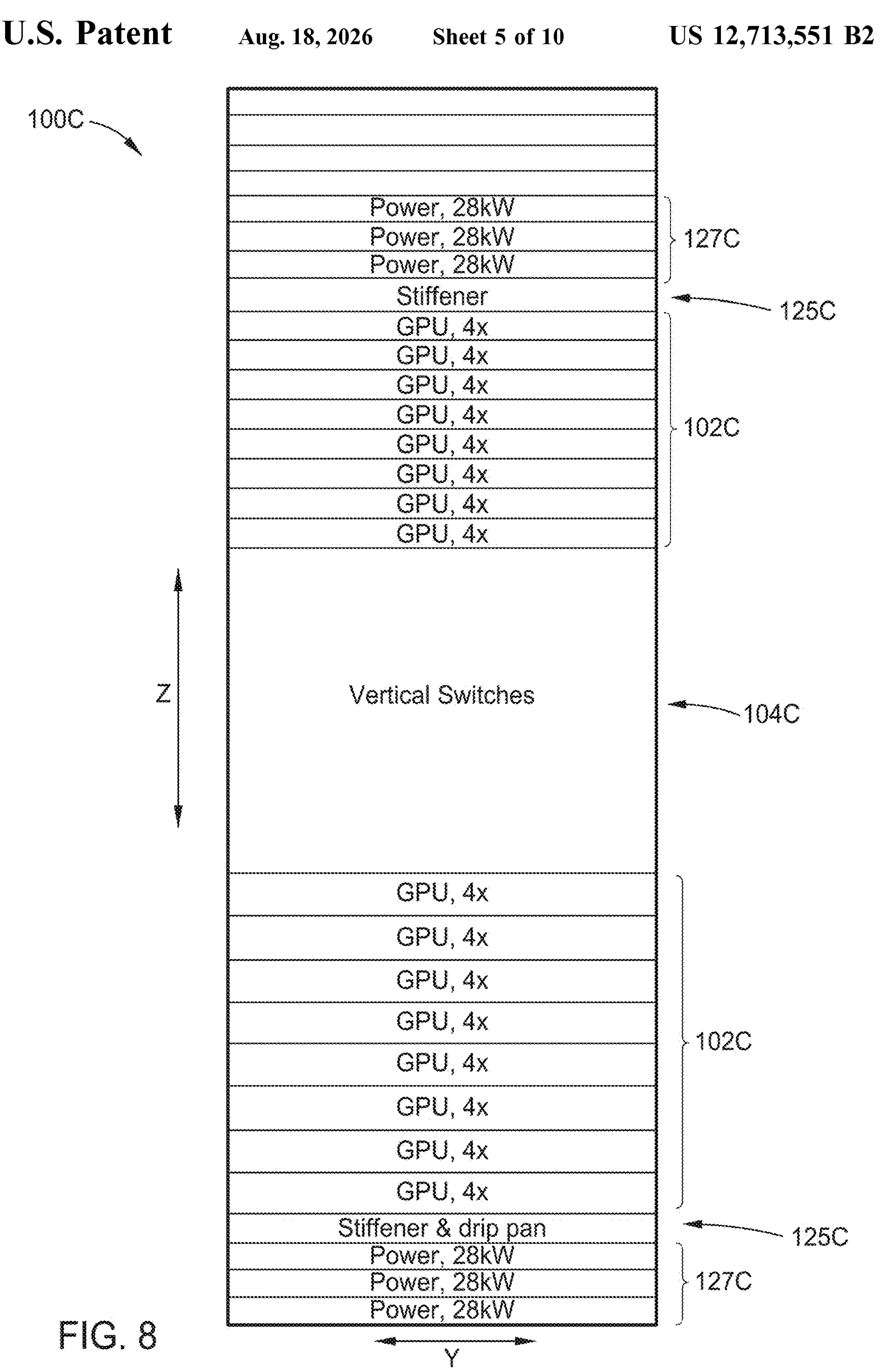

FIGS. 7 and 8 illustrate various implementations of the rack 100 of FIGS. 1 and 2.

As shown in FIG. 7, the rack 100 of FIGS. 1 and 2 can be implemented as a rack 100B having a 32 GPU pod. The rack 100B includes eight (8) horizontal compute trays 102B that each include four (4) GPUs, a plurality of vertical switch trays 104B (with four (4) of the horizontal compute trays 102B disposed above and four (4) horizontal compute trays 102B disposed below the vertical switch trays 104B), one or more horizontal stiffener/drip pans 125B, and four (4) horizontal power trays 127B for storing power components. Although not shown in the front view of FIG. 7, the rack 100B can include at least one L-shaped cable cartridge coupling at least one of the horizontal compute trays 102B with at least one of the vertical switch trays 104B.

As shown in FIG. 8, the rack 100 of FIGS. 1 and 2 can be implemented as a rack 100B having a 64 GPU pod. The rack 100C includes sixteen (16) horizontal compute trays 102C that each include four (4) GPUs, a plurality of vertical switch trays 104C (with eight (8) of the horizontal compute trays 102C disposed above and eight (8) horizontal compute trays 102C disposed below the vertical switch trays 104C), one or more horizontal stiffener/drip pans 125C, and six (6) power trays 127C for storing power components. In some embodiments, the 64 GPU pod of the rack 100C of FIG. 8 can include twice as many switch trays as the 32 GPU pod of the rack 100B of FIG. 7 to provide enough switching support for twice as many GPU trays. Although not shown in the front view of FIG. 8, the rack 100C can include at least one L-shaped cable cartridge coupling at least one of the horizontal compute trays 102C with at least one of the vertical switch trays 104C.

Further, in some embodiments, any of the racks disclosed herein can be arranged as a deep ORv3 rack (e.g., 1200 mm) for mounting the trays. In some aspects, the GPU trays may be 1.5 OU GPU trays with 1024 differential pair (DP) connectors. In some embodiments, the vertical switch trays may include shuttle connectors. Moreover, the number of GPU trays may be reduced to reduce the size of the pods.

Further, the racks 100B, 100C in FIGS. 7 and 8 can be arranged to leave rack space available for management, front end network (FE NW), and a rack controller.

In some further embodiments, any one of the racks of the present disclosure can include Standard ORv3-32 OU for GPU plus accelerated fabric link (AFL) switching as well as dense power shelves (as desired to save OU) or standard shelves in extra high racks. The racks of the present disclosure can use approximately 160 kW of power, for example. In one example, a rack can include sixteen (16) 1.5 OU 1 CPU plus 4 GPU compute trays that are interconnected by eight (8) vertical switch trays (2×256 or 8×64 port per tray). In yet other embodiments, the L-shaped cable cartridges can be attached to the front side of the rack (i.e., the side in which the trays are slid into the rack). This leaves the rear side for rear cabling, backside quick disconnect (QD) liquid-cooling.

Figure 9:
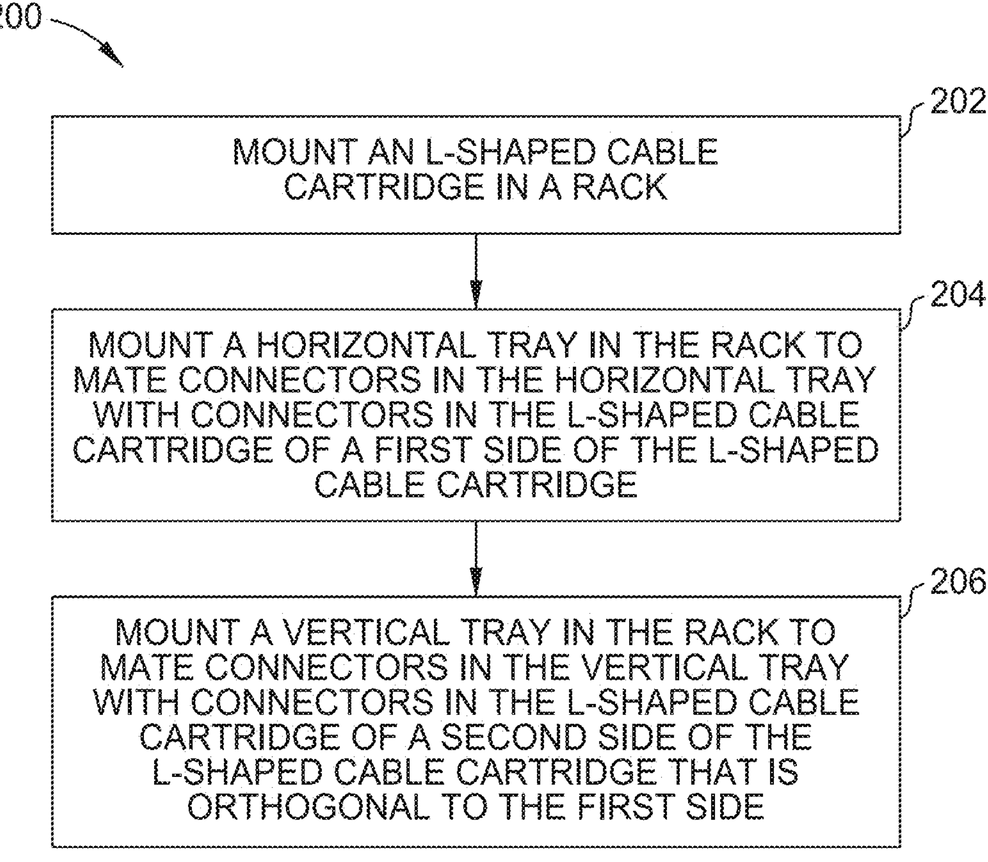
FIG. 9 is a flow diagram for a method of assembling a rack according to an example embodiment of the present disclosure.

FIG. 9 is a flow diagram for a method 200 of assembling a rack.

At 202, the method 200 can include mounting an L-shaped cable cartridge in a rack. For instance, the L-shaped cable cartridge can be coupled with a frame of the rack. As one example, the L-shaped cable cartridge can be bolted to the frame. As another example, the L-shaped cable cartridge can be slid into the rack and mounted to a shelf of the frame. In some implementations, the L-shaped cable cartridge can be mounted at a rear side of the rack. The L-shaped cable cartridge can be mounted in the rack such that a first elongate portion of the rack is vertically oriented while a second elongate portion of the rack is horizontally oriented. The first portion can include backplane connectors facing the front side of the rack and the second portion can include cammed connectors facing downward toward a bottom of the rack or upward toward a top of the rack, depending on the mounting orientation of the L-shaped cable cartridge within the rack. Cables, which can be pre-wired before mounting of the L-shaped cable cartridge in the rack, can extend within the first and second portions and connect respective pairs of backplane and cammed connectors.

Accordingly, the L-shaped cable cartridge can be mounted in the rack so that a first set of the connectors in the L-shaped cable cartridge arranged in a vertically-oriented portion of the L-shaped cable cartridge face toward a front side or a rear side of the rack and so that a second set of the connectors in the L-shaped cable cartridge arranged in a horizontally-oriented portion of the L-shaped cable cartridge face toward a top or a bottom of the rack. As will be explained below, connectors in a horizontal tray can mate with the connectors of the first set and connectors in a vertical tray can mate with the connectors of the second set.

At 204, the method 200 can include mounting a horizontal tray in the rack to mate connectors in the horizontal tray with connectors in the L-shaped cable cartridge of a first side of the L-shaped cable cartridge. For instance, a horizontal tray, which can be a horizontal compute tray having one or more compute elements (e.g., GPUs), can be slid into the rack in a forward-to-rearward direction so that horizontal tray connectors arranged along a rear wall of the horizontal tray mate with the backplane connectors of the L-shaped cable cartridge. A force applied to the horizontal tray (e.g., at a front wall of the horizontal tray) can cause the horizontal tray connectors to mate with the backplane connectors of the L-shaped cable cartridge. The backplane connectors can be arranged along a first side (e.g., an internal side or vertically-oriented face) of the L-shaped cable cartridge.

At 206, the method 200 can include mounting a vertical tray in the rack to mate connectors in the vertical tray with connectors in the L-shaped cable cartridge of a second side of the L-shaped cable cartridge that is orthogonal to the first side. For instance, a vertical tray, which can be a vertical switch tray having one or more switch elements, can be slid into the rack in a forward-to-rearward direction so that vertical tray connectors arranged along a top or bottom wall of the vertical tray align with the cammed connectors of the L-shaped cable cartridge. The cammed connectors can be arranged along a second side of the L-shaped cable cartridge (e.g., a connector-interface side or horizontally-oriented face) of the L-shaped cable cartridge. The second side of the L-shaped cable cartridge, along which the cammed connectors are arranged, is orthogonal to the first side of the L-shaped cable cartridge, along which the backplane connectors are arranged. Unlike the horizontal tray that is horizontally oriented in the rack, the vertical tray is vertically oriented when arranged in the rack.

Once the vertical tray connectors of the vertical tray are aligned with the cammed connectors of the L-shaped cable cartridge, e.g., along the sliding direction, the cammed connectors can be shuttled, actuated, or otherwise moved to mate with the vertical tray connectors of the vertical tray. The cammed connectors can be moved toward the vertical tray connectors along a direction that is orthogonal to the sliding direction. For instance, the sliding direction can be a horizontal direction and the cammed connectors can be moved along a vertical direction that is orthogonal to the horizontal direction. In some implementations, the connectors in the second side of the L-shaped cable cartridge can be actuated in series, or rather, sequentially one after another. In other implementations, the connectors in the second side of the L-shaped cable cartridge are actuated in parallel, or rather, simultaneously.

Accordingly, mounting the vertical tray in the rack to mate the connectors in the vertical tray with the connectors in the second side of the L-shaped cable cartridge can include sliding the vertical tray into the rack so that the connectors in the vertical tray align with the connectors of the L-shaped cable cartridge, and then actuating the connectors of the L-shaped cable cartridge to mate with the connectors in the vertical tray.

In some implementations, a plurality of horizontal trays and a plurality of vertical trays can be mounted in the rack in accordance with 204, 206 of the method 200.

Actuation System

Different actuation techniques for coupling connectors in a tray to connectors in an L-shaped cable cartridge will now be described. Generally, in some embodiments, one set of connectors can be moved or actuated while the other set of connectors can be fixed. The movable connectors can be on the L-shaped cable cartridge while the fixed connectors can be on the tray, or vice versa. In some embodiments, both sets of connectors can be moved or actuated. That is, the set of connectors of the tray and the set of connectors of the L-shaped cable cartridge can both be movable connectors. Example embodiments are provided below.

Figure 10A:
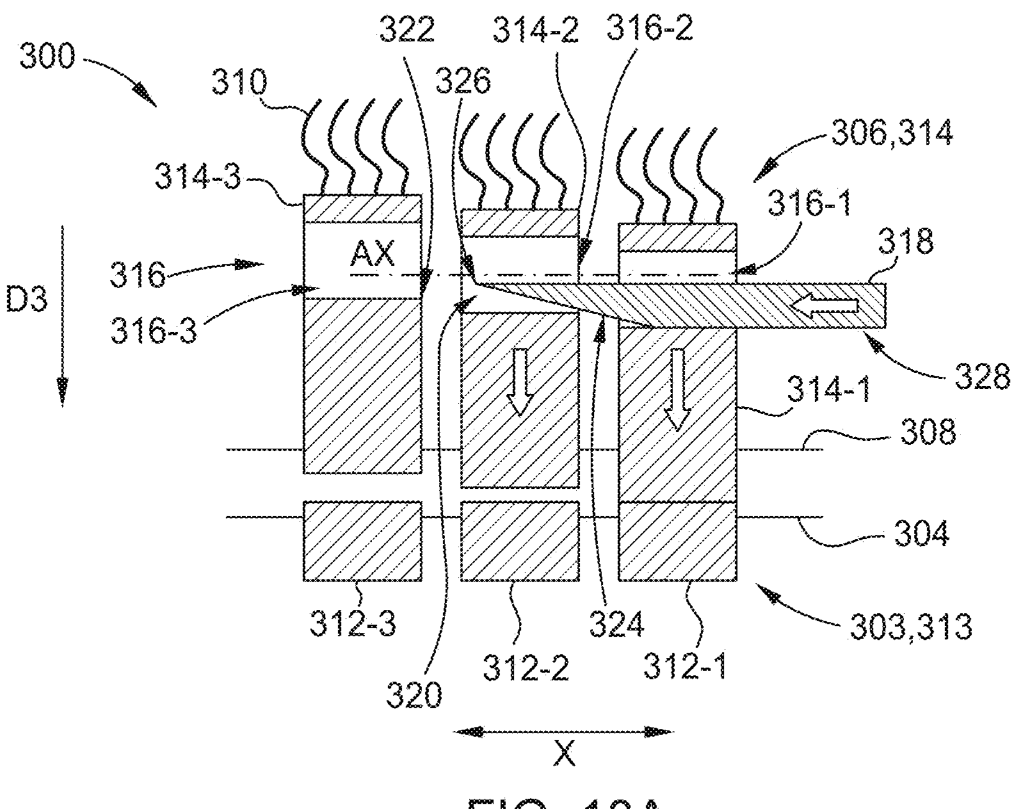
FIGS. 10A and 10B illustrate an actuation system for coupling connectors in a tray to connectors in an L-shaped cable cartridge according to an example embodiment of the present disclosure.

With reference now to FIG. 10A, an actuation system 300 for mating respective pairs of connectors is provided. As depicted, the actuation system 300 includes a first set of electrical connectors 302 disposed on a side of a tray 304 along a first direction X, wherein the tray 304 is configured to mount in a rack, such as any of the racks disclosed herein. The first set of electrical connectors 302 can be arranged in a sidewall of the tray 304, for example. The actuation system 300 also includes a second set of electrical connectors 306.

The second set of electrical connectors 306 can be disposed in an L-shaped cable cartridge 308. One or more cables 310 can be coupled with each electrical connector of the second set of electrical connectors 306. The second set of electrical connectors 306 can be aligned with the first set of electrical connectors 302 along the first direction X. For instance, the tray 304 can be slid into a rack and the L-shaped cable cartridge 308 can be slid into the rack as well so as to be in an engaged position with respect to the tray 304, e.g., so that the connectors respectively align.

One of the first and second sets of electrical connectors 302, 306 includes actuated connectors while the other set includes fixed connectors. In the embodiment of FIG. 10A, the first set of electrical connectors 302 includes fixed connectors 312 (e.g., vertical tray connectors 164 as shown in FIG. 6), including a first fixed connector 312-1, a second fixed connector 312-2, and a third fixed connector 312-3. The fixed connectors 312 are spaced from one another along the first direction X. The second set of electrical connectors 306 includes actuated connectors 314 (e.g., cammed connectors 121 as shown in FIG. 6), including a first actuated connector 314-1, a second actuated connector 314-2, and a third actuated connector 314-3. The actuated connectors 314 are spaced from one another along the first direction X, and in FIG. 10A, the first, second, and third actuated connectors 314-1, 314-2, 314-3 are aligned with the first, second, and third fixed connectors 312-1, 312-2, 312-3 along the first direction X, respectively. In other embodiments, the first set of electrical connectors 302 can include actuated connectors and the second set of electrical connectors 306 can include fixed connectors.

Each one of the actuated connectors 314 can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 10A, the first actuated connector 314-1 is in an extended position and mated with the first fixed connector 312-1 while the third actuated connector 314-3 is in a retracted position and not mated with the third fixed connector 312-3. The second actuated connector 314-2 is in an intermediate position between the extended position and the retracted position.

As shown in FIG. 10A, the actuated connectors 314 include connection elements 316 to be used to extend the actuated connectors 314 to mate with the fixed connectors 312. In some embodiments, such as in the embodiment of FIG. 10A, the connection elements 316 include a respective slot in each of the actuated connectors 314, with the respective slots being aligned along a first axis AX. That is, the slots are aligned with the first axis AX in that they allow for a tool 318, such as an actuation spear, to be inserted therethrough along the first axis AX, which is parallel with the first direction X. For instance, the first actuated connector 314-1 includes a first slot 316-1, the second actuated connector 314-2 includes a second slot 316-2, and the third actuated connector 314-3 includes a third slot 316-3. The first, second, and third slots 316-1, 316-2, 316-3 are aligned with the first axis AX in that the tool 318 can be inserted therethrough along the first axis AX, e.g., to move or actuate the actuated connectors 314. Each slot can be aligned with the first axis AX regardless of whether a given slot is in an extended position, a retracted position, or some position therebetween.

In some embodiments, the first, second, and third slots 316-1, 316-2, 316-3 are configured to receive the tool 318 having a sloped tip 320. The tool 318 can be moved through the first, second, and third slots 316-1, 316-2, 316-3 so that the sloped tip 320 sequentially engages with the actuated connectors 314 to move them in a direction D2 towards the fixed connectors 312, with the direction D2 being perpendicular to the first direction X. In some embodiments, the sloped tip 320 can sequentially engage the actuated connectors 314 (e.g., respective first surfaces 322 or first edges of each of the actuated connectors 314). In this regard, in some embodiments, the connection elements 316 are configured such that pairs of the first and second sets of electrical connectors 302, 306 are mated sequentially along the first direction X.

Specifically, as shown in FIG. 10A, the tool 318 can be inserted manually (from right to left in FIG. 10A) into the slots 316-1, 316-2, 316-3, which moves the actuated connectors 314 along the direction D2 towards the fixed connectors 312 (which can be male and female connectors, respectively) to mate each pair of connectors. For example, the sloped tip 320 arranged at a tip of the tool 318 can be used to move the actuated connectors 314 towards the fixed connectors 312. Particularly, to move a given one of the actuated connectors 314 from the retracted position to the extended position, as the tool 318 is moved along the first direction X (e.g., from right to left in FIG. 10A) a sloped surface 324 of the sloped tip 320 can engage a first surface 322 of the given actuated connector, and as the tool 318 is moved further along the first direction X (e.g., further to the left in FIG. 10A), the first surface 322 slides along the sloped surface 324 away from a leading edge 326 of the tool 318. This action moves the given actuated connector toward its corresponding fixed connector along the direction D2. Eventually, the given actuated connector is moved to the extended position and in mating engagement with its corresponding fixed connector. Once the tool 318 has moved the given actuated connector to the extended position, a planar surface 328 of the tool 318 can engage the given actuated connector while the sloped surface 324 of the tool 318 no longer contacts the given actuated connector. Moreover, the tool 318 can continue to be moved along the first direction X to actuate other actuated connectors to the extended position.

Accordingly, the manual actuation of the tool 318 works like a zipper, where the actuated connectors 314 are actuated individually or at least mated at different times with their corresponding fixed connectors 312. This can be advantageous since less force can be applied to the actuated connectors 314 when mating, relative to a technique that mates the connectors on the same tray at the same time (i.e., in parallel).

Figure 10B:
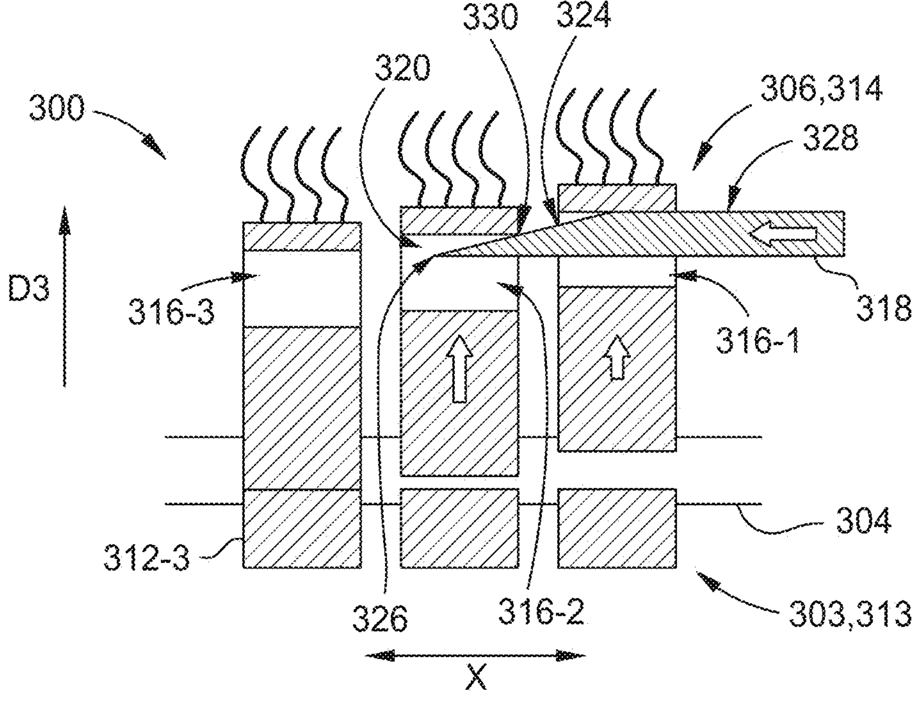

FIG. 10B illustrates that the tool 318 can be used to reverse the mating process or decoupling of the connectors. As depicted, the sloped tip 320 of the tool 318 can push (when again inserted from right to left) the actuated connectors 314 away from the fixed connectors 312. For the decoupling process, the tool 318 can be inverted (with respect to its position for the coupling process as shown in FIG. 10A) so that the sloped surface 324 faces away from the fixed connectors 312. The tool 318 can be moved along the first direction X (e.g., from right to left in FIG. 10B) to sequentially move or actuate the actuated connectors 314.

Particularly, as shown in FIG. 10B, the tool 318 can be inserted manually (from right to left in FIG. 10A) into the slots 316-1, 316-2, 316-3, which moves the actuated connectors 314 along a direction D3 away from the fixed connectors 312 to disengage each pair of connectors. Particularly, to move a given one of the actuated connectors 314 from the extended position to the retracted position, as the tool 318 is moved along the first direction X (e.g., from right to left in FIG. 10B) the sloped surface 324 of the sloped tip 320 can engage a second surface 330 of the given actuated connector, and as the tool 318 is moved further along the first direction X (e.g., further to the left in FIG. 10B), the second surface 330 slides along the sloped surface 324 away from the leading edge 326 of the tool 318. This action moves the given actuated connector away from its corresponding fixed connector along the direction D3. Eventually, the given actuated connector is moved to the retracted position. Once the tool 318 has moved the given actuated connector to the retracted position, the planar surface 328 of the tool 318 can engage the given actuated connector while the sloped surface 324 of the tool 318 no longer contacts the given actuated connector. Moreover, the tool 318 can continue to be moved along the first direction X to actuate other actuated connectors to the retracted position. Accordingly, the manual actuation of the tool 318 works like a zipper in the reverse direction, where the actuated connectors 314 are actuated individually at different times away from their corresponding fixed connectors 312. This can be advantageous since less force can be applied to the actuated connectors 314 to disengage them, relative to a technique that disengages the connectors on the same tray at the same time (i.e., in parallel).

Figure 11A:
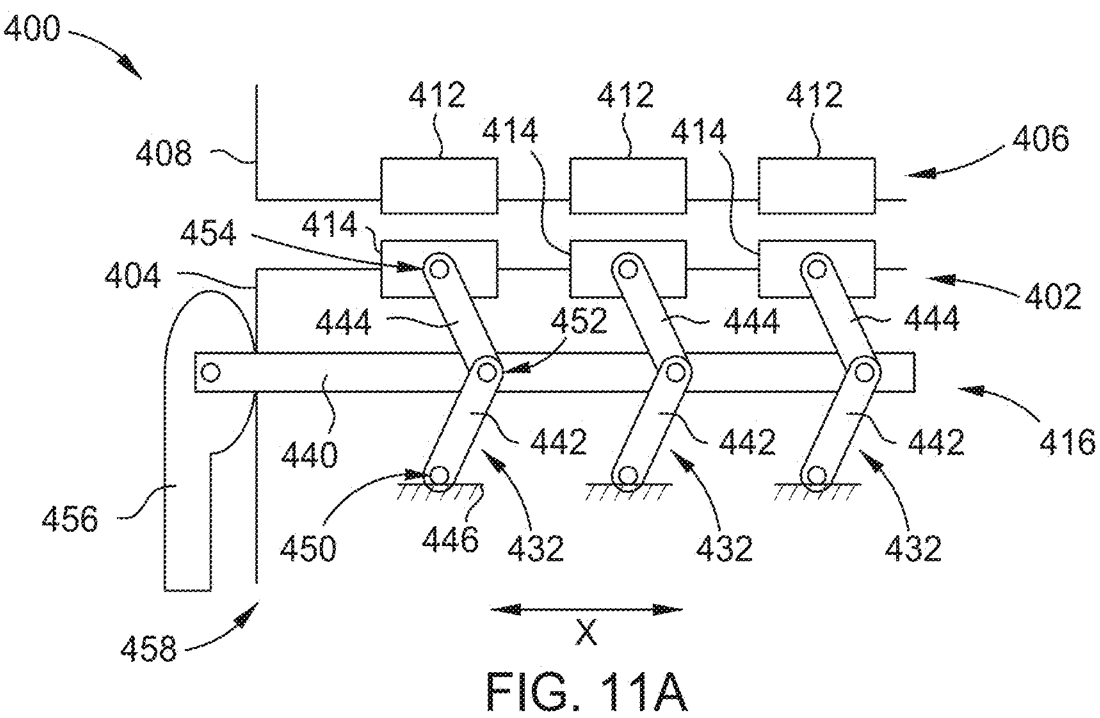
FIGS. 11A and 11B illustrate an actuation system for coupling connectors in a tray to connectors in an L-shaped cable cartridge according to an example embodiment of the present disclosure.

With reference now to FIG. 11A, an actuation system 400 for mating respective pairs of connectors is provided. As illustrated, the actuation system 400 includes a first set of electrical connectors 402 disposed on a side of a tray 404 along a first direction X, wherein the tray 404 is configured to mount in a rack, such as any of the racks disclosed herein. The first set of electrical connectors 402 can be arranged in a sidewall of the tray 404, for example. The actuation system 400 also includes a second set of electrical connectors 406. The second set of electrical connectors 406 can be disposed in an L-shaped cable cartridge 408. One or more cables can be coupled with each electrical connector of the second set of electrical connectors 406. The second set of electrical connectors 406 can be aligned with the first set of electrical connectors 402 along the first direction X.

One of the first and second sets of electrical connectors 402, 406 includes actuated connectors while the other set includes fixed connectors. In the embodiment of FIG. 11A, the first set of electrical connectors 402 includes actuated connectors 414 (e.g., vertical tray connectors 164 as shown in FIG. 6). The actuated connectors 414 are spaced from one another along the first direction X. The second set of electrical connectors 406 includes fixed connectors 412 (e.g., cammed connectors 121 as shown in FIG. 6). The fixed connectors 412 are spaced from one another along the first direction X. In other embodiments, the first set of electrical connectors 402 can include fixed connectors and the second set of electrical connectors 406 can include actuated connectors.

Each one of the actuated connectors 414 can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 11A, each of the actuated connectors 414 are in a retracted position. In contrast, in FIG. 11B, each of the actuated connectors 414 are in an extended position.

Figure 11B:
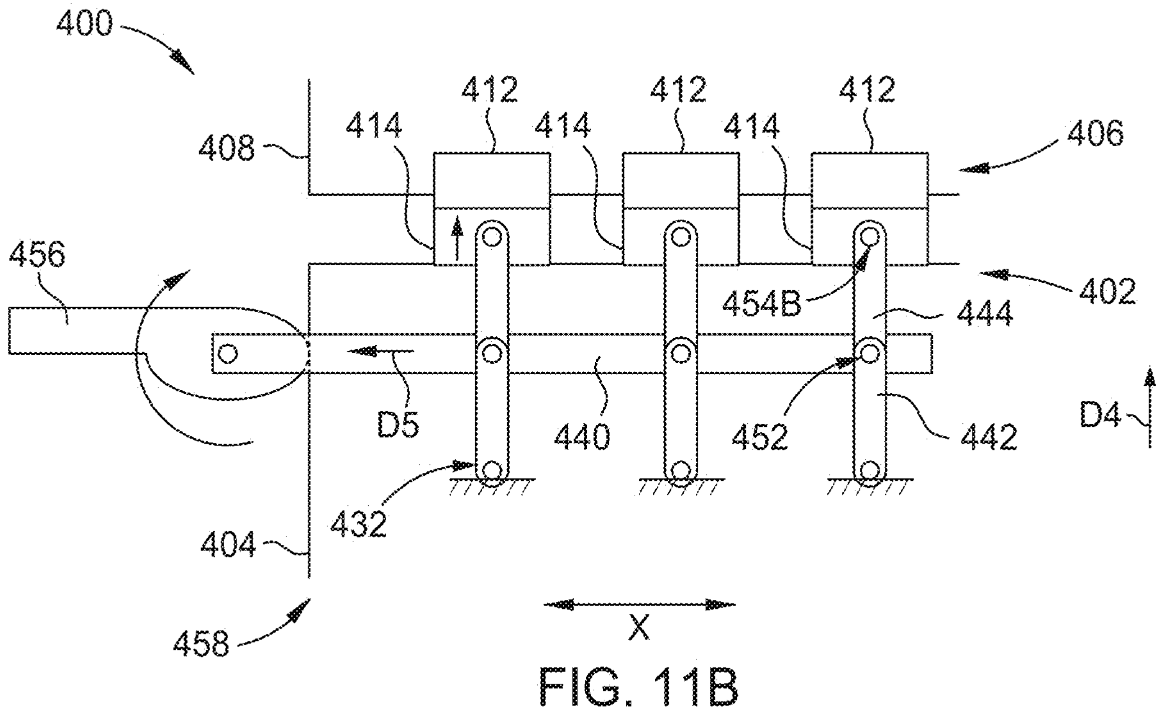

As shown in FIG. 11A, the actuated connectors 414 include connection elements 416 to be used to extend the actuated connectors 414 to mate with the fixed connectors 412. In some embodiments, such as in the embodiment of FIG. 11A, the connection elements 416 include a plurality of arms 432 coupled to a bar 440. When the bar 440 is actuated in a direction along the first direction X, the plurality of arms 432 move the actuated connectors 414 in a direction towards the fixed connectors 412, or rather a direction D4 as shown in FIG. 11B.

More specifically, each of the plurality of arms 432 includes a first linkage 442 and a second linkage 444, or rather, a structure-to-bar linkage and a bar-to-connector linkage. The first linkage 442 of a given arm couples the bar 440 with a fixed structure 446. One end of the first linkage 442 can be pivotably coupled (e.g., by a pin) with the fixed structure 446 at a structure connection point 450 so that first linkage 442 can pivot or rotate when the bar 440 is moved. The other end of the first linkage 442 is coupled with the bar 440 (e.g., by a pin) at a bar connection point 452. The second linkage 444 of the given arm couples the bar 440 with one of the actuated connectors 414. One end of the second linkage 444 can be pivotably coupled (e.g., by a pin) with the actuated connector 414 at a connector connection point 454 so that second linkage 444 can pivot or rotate when the bar 440 is moved. The other end of the second linkage 444 is coupled with the bar 440 (e.g., by a pin) at the bar connection point 452. In some embodiments, a single pin can couple the first and second linkages 442, 444 of the given arm with the bar 440 at the bar connection point 452. In other embodiments, the first and second linkages 442, 444 can be coupled with the bar at separate bar connection points.

To move the actuated connectors 414 from the retracted position to the extended position (e.g., from their positions in FIG. 11A to their positions in FIG. 11B), a lever 456 coupled with the bar 440 can be moved (e.g., rotated manually or by an automated mechanism, such as an electric motor) to pull the bar 440 towards a front side 458 of the tray 404 (or alternatively the rear side of the tray 404). In this way, the bar 440 can be moved in a direction D5 along the first direction X. The arms 432 coupled to the bar 440 straighten as the lever 456 is actuated. That is, the movement of the bar 440 in the direction D5 drives the bar connection points 452 of the arms 432 to align with their respective structure connection points 450 and their respective connector connection points 454, which straightens the first and second linkages 442, 444 as shown in FIG. 11B (in contrast, in FIG. 11A, the bar connection points 452 of the arms 432 are offset from their respective structure connection points 450 and their respective connector connection points 454). Accordingly, the movement of the bar 440 moves the actuated connectors 414 toward the fixed connectors 412 so that they mate with the fixed connectors 412, e.g., as shown in FIG. 11B. In some embodiments, such as in the embodiment of FIGS. 11A and 11B, the connection elements 416 are configured such that pairs of the first and second sets of electrical connectors 402, 406 are mated in parallel along the first direction X, or rather, at the same time. In some other embodiments, slots can be added to the bar 440 so the connectors 402, 406 are mated in a zipper or sequential manner rather than in parallel.

To move the actuated connectors 414 from the extended position to the retracted position (e.g., from their positions in FIG. 11B to their positions in FIG. 11A), the process described above can be reversed. The lever 456 coupled with the bar 440 can be moved (e.g., rotated manually or by an automated mechanism, such as an electric motor) to push the bar 440 away from the front side 458 of the tray 404. In this way, the bar 440 can be moved in a direction opposite the direction D5 along the first direction X. The arms 432 coupled to the bar 440 become less straight as the lever 456 is actuated. That is, the movement of the bar 440 in the direction opposite the direction D5 drives the bar connection points 452 of the arms 432 out of or further out of alignment with their respective structure connection points 450 and their respective connector connection points 454. Accordingly, the movement of the bar 440 in the direction opposite the direction D5 moves the actuated connectors 414 away from the fixed connectors 412. In some embodiments, such as in the embodiment of FIGS. 11A and 11B, the connection elements 416 are configured such that pairs of the first and second sets of electrical connectors 402, 406 are disengaged in parallel, or rather, at the same time. In some other embodiments, slots can be added to the bar 440 so the connectors 402, 406 are disengaged in a zipper or sequential manner rather than in parallel.

Figure 12A:
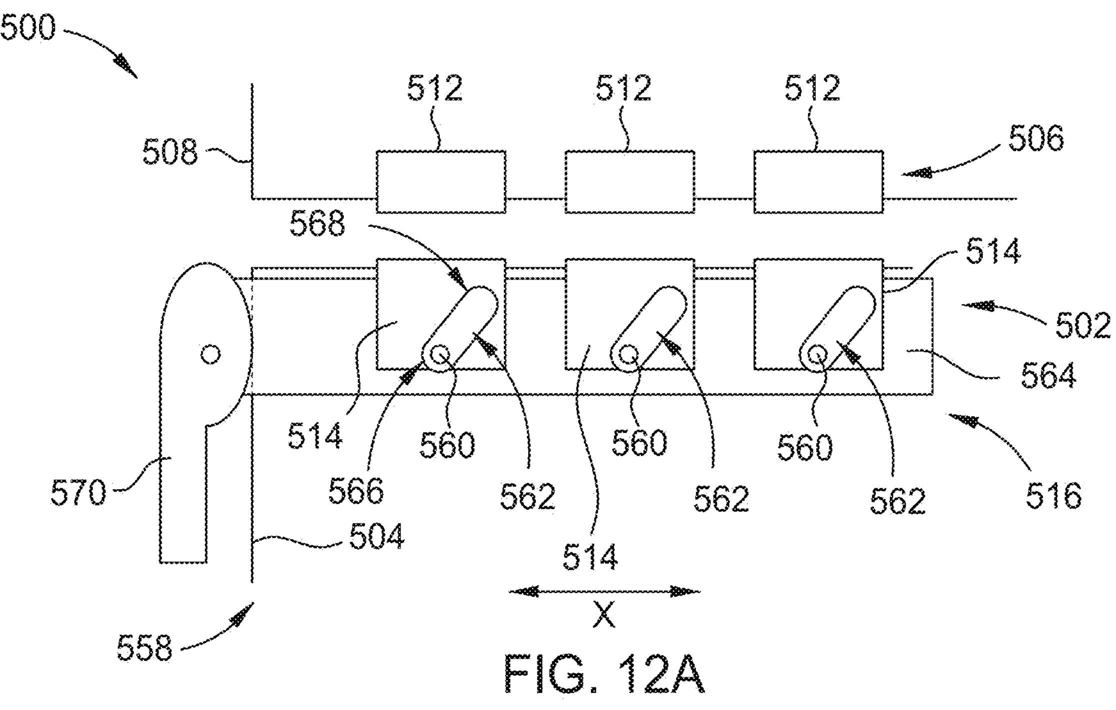
FIGS. 12A and 12B illustrate an actuation system for coupling connectors in a tray to connectors in an L-shaped cable cartridge according to an example embodiment of the present disclosure.

With reference now to FIG. 12A, an actuation system 500 for mating respective pairs of connectors is provided. As shown, the actuation system 500 includes a first set of electrical connectors 502 disposed on a side of a tray 504 along a first direction X, wherein the tray 504 is configured to mount in a rack, such as any of the racks disclosed herein. The first direction X can extend along the first direction X (FIG. 1), for example. The first set of electrical connectors 502 can be arranged in a sidewall of the tray 504, for example. The actuation system 500 also includes a second set of electrical connectors 506. The second set of electrical connectors 506 can be disposed in an L-shaped cable cartridge 508. One or more cables can be coupled with each electrical connector of the second set of electrical connectors 506. The second set of electrical connectors 506 can be aligned with the first set of electrical connectors 502 along the first direction X.

One of the first and second sets of electrical connectors 502, 506 includes actuated connectors while the other set includes fixed connectors. In the embodiment of FIG. 12A, the first set of electrical connectors 502 includes actuated connectors 514 (e.g., vertical tray connectors 164 as shown in FIG. 6). The actuated connectors 514 are spaced from one another along the first direction X. The second set of electrical connectors 506 includes fixed connectors 512 (e.g., cammed connectors 121 as shown in FIG. 6). The fixed connectors 512 are spaced from one another along the first direction X. In other embodiments, the first set of electrical connectors 502 can include actuated connectors and the second set of electrical connectors 506 can include fixed connectors.

Each one of the actuated connectors 514 can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 12A, each of the actuated connectors 514 are in a retracted position. In contrast, in FIG. 12B, each of the actuated connectors 514 are in an extended position.

As shown in FIG. 12A, the actuated connectors 514 include connection elements 516 to be used to extend the actuated connectors 514 to mate with the fixed connectors 512. In some embodiments, such as in the embodiment of FIG. 12A, the connection elements 516 include a plurality of connector pins 560 that are slidably received within respective slots 562 in a bar 564. When the bar 564 is actuated in a direction D6 along the first direction X, the plurality of connector pins 560 move in the respective slots 562 to move the actuated connectors 514 in a direction D7 towards the fixed connectors 512.

The slots 562 of the bar 564 are spaced apart from one another, e.g., along the first direction X, and are defined at an angle relative to the first direction X, e.g., at forty-five degrees (45°) with respect to the first direction X. Each one of the slots 562 is elongated and has a first end 566 and a second end 568. The connector pins 560 can be slidably received within respective ones of the slots 562. The connector pins 560 are rigidly attached to their respective actuated connectors 514.

Figure 12B:
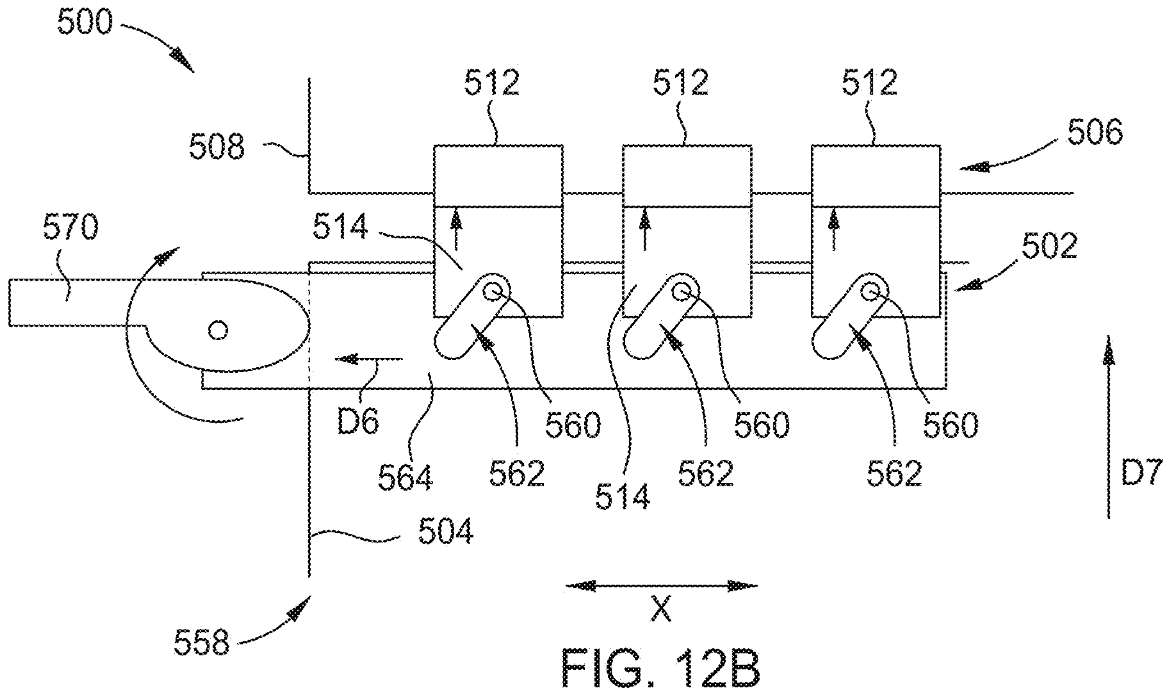

To move the actuated connectors 514 from the retracted position to the extended position (e.g., from their positions in FIG. 12A to their positions in FIG. 12B), a lever 570 coupled with the bar 564 can be moved (e.g., rotated manually or by an automated mechanism, such as an electric motor) to pull the bar 564 towards a front side 558 of the tray 504 (or alternatively the rear side of the tray 504). In this way, the bar 564 can be moved in the direction D6 along the first direction X. When the bar 564 is moved toward the front side 558, the connector pins 560 are slid within their respective slots 562, e.g., from the first end 566 to the second end 568 of their respective slots 562, or rather, from their positions in FIG. 12A to their positions in FIG. 12B. This action moves the actuated connectors 514 toward the fixed connectors 512 so that they mate with the fixed connectors 512, e.g., as shown in FIG. 12B. In some embodiments, such as in the embodiment of FIGS. 12A and 12B, the connection elements 516 are configured such that pairs of the first and second sets of electrical connectors 502, 506 are mated in parallel along the first direction X, or rather, at the same time.

To move the actuated connectors 514 from the extended position to the retracted position (e.g., from their positions in FIG. 12B to their positions in FIG. 12A), the process described above can be reversed. The lever 570 coupled with the bar 564 can be moved (e.g., rotated manually or by an automated mechanism, such as an electric motor) to push the bar 564 away from the front side 558 of the tray 504. In this way, the bar 564 can be moved in a direction opposite the direction D6 along the first direction X. When the bar 564 is moved in a direction opposite the direction D6, the connector pins 560 are slid within their respective slots 562, e.g., from the second end 568 to the first end 566 of their respective slots 562, or rather, from their positions in FIG. 12B to their positions in FIG. 12A. This action moves the actuated connectors 514 away from the fixed connectors 512 so that they disengage from the fixed connectors 512. In some embodiments, such as in the embodiment of FIGS. 12A and 12B, the connection elements 516 are configured such that pairs of the first and second sets of electrical connectors 502, 506 are disengaged in parallel, or rather, at the same time.

In some alternative embodiments, the slots 562 and the connector pins 560 can be arranged so that the actuated connectors are mated or disengaged in a zipper manner (i.e., sequentially) rather than simultaneously as described above. For instance, the sots can be angled differently than one another, have differently lengths, etc.

Figures 13A, 13B, 13C:
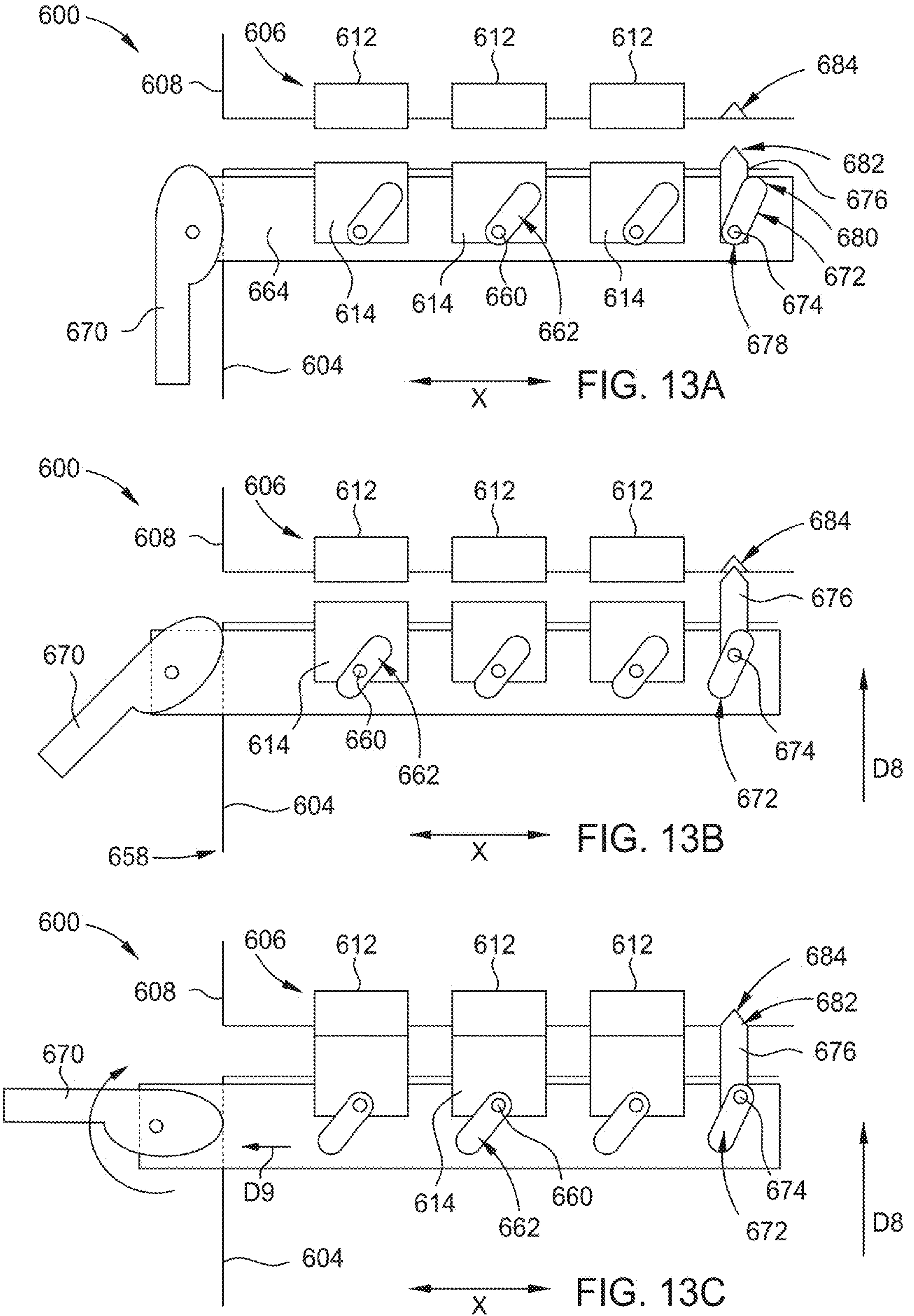
FIGS. 13A, 13B, and 13C illustrate an actuation system coupling connectors in a tray to connectors in an L-shaped cable cartridge according to an example embodiment of the present disclosure.

With reference now to FIG. 13A, 13B, 13C, an actuation system 600 for mating respective pairs of connectors is provided. The actuation system 600 of FIGS. 13A, 13B, 13C is arranged in a similar manner as the actuation system 500 of FIGS. 12A, 12B, except as provided below.

In the embodiment of FIGS. 13A, 13B, and 13C, a bar 664 of the actuation system 600 defines a plurality of slots 662 each configured to slidably receive respective connector pins 660 of actuated connectors 614 (e.g., vertical tray connectors 164 as shown in FIG. 6). The bar 664 also defines a guide slot 672 that is arranged to slidably receive a guide pin 674 of an alignment guide 676. The guide slot 672 is elongated and has a first end 678 and a second end 680. The guide pin 674 is rigidly attached to the alignment guide 676. In this example embodiment, the alignment guide 676 is arranged as a post having a pointed tip 682. However, the alignment guide 676 can have other shapes in other embodiments. The alignment guide 676 is arranged to be received within a guide socket 684, which is defined by an L-shaped cable cartridge 608 in this example embodiment. In some embodiments, the guide socket 684 can be shaped complementary to the pointed tip 682 of the alignment guide 676.

The slots 662 of the bar 664 are defined at an angle relative to the first direction X, e.g., at forty-five degrees (45°) with respect to the first direction X. The guide slot 672 is also defined at an angle relative to the first direction X, but at a different angle than the slots 662 (e.g., at seventy degrees (70°) with respect to the first direction X). In at least some embodiments, the guide slot 672 is defined at an angle that is at least twice as great as the angles of the slots 662, relative to the first direction X. For instance, in embodiments in which the guide slot 672 is arranged at sixty degrees (60°) with respect to the first direction X, the slots 662 are arranged at or less than thirty degrees (30°) with respect to the first direction X. In at least some embodiments, the guide slot 672 is defined at an angle so that the alignment guide 676 extends at a faster rate than the actuated connectors 614, which allows the alignment guide 676 to be received within the guide socket 684 first or before the actuated connectors 614 mate with their respective fixed connectors 612 (e.g., cammed connectors 121 as shown in FIG. 6). This provides an initial stage of alignment before the actuated connectors 614 are mated with their respective fixed connectors 612.

To move the actuated connectors 614 from the retracted position to the extended position (e.g., along a direction D8 from their positions in FIG. 13A to their positions in FIG. 13C), a lever 670 coupled with the bar 664 can be moved (e.g., rotated manually or by an automated mechanism, such as an electric motor) to pull the bar 664 towards a front side 658 of the tray 604 (or alternatively the rear side of the tray 604). In this way, the bar 664 can be moved in a direction D9 along the first direction X. When the bar 664 is moved along the direction D9, connector pins 660 of the actuated connectors 614 are slid within their respective slots 662 while the guide pin 674 is slid within the guide slot 672. The guide pin 674 slides within the guide slot 672 at a faster rate than does the connectors pins 660 within their respective slots 662. As shown in FIG. 13B, which shows an intermediate position during an actuation process, the guide pin 674 is further toward the second end 680 of the guide slot 672 than the connector pins 660 are toward the second ends of their respective slots 662. Moreover, as illustrated in FIG. 13B, the alignment guide 676 is received, at least in part, within the guide socket 684 before the actuated connectors 614 reach or mate with their respective fixed connectors 612. Accordingly, the alignment guide 676 facilitates alignment of the actuator connectors 614 with their corresponding fixed connectors 612 before mating (e.g., along the first direction X). In FIG. 13C, a greater portion of the alignment guide 676 is received within the guide socket 684 (than in FIG. 13B), and the actuated connectors 614 are in mating engagement with their fixed connectors 612. The actuated connectors 614 can be disengaged from their fixed connectors 612 and moved from the extended position to the retracted position (e.g., along a direction opposite the direction D8 from their positions in FIG. 13C to their positions in FIG. 13A) by implementing the above-noted technique in reverse.

In some alternative embodiments, the slots 662 and the connector pins 660 can be arranged so that the actuated connectors are mated or disengaged in a zipper manner (i.e., sequentially) rather than simultaneously as described above. For instance, the sots can be angled differently than one another, have differently lengths, etc.

While only one alignment guide and one guide socket are depicted in FIGS. 13A, 13B, and 13C, in some embodiments, the actuation system 600 can include multiple alignment guides and corresponding guide sockets, e.g., arranged along the first direction X.

In some further embodiments, any of the actuation systems described above can be modified so that both sets of connectors can be moved or actuated. That is, the set of connectors of the tray and the set of connectors of the cable cartridge can both be movable or actuated connectors. Any combination of the actuated connectors can be used. For instance, in one example embodiment, a first set of connectors can be actuated in parallel, e.g., using the technique described in FIGS. 11A, 11B or FIGS. 12A, 12B or FIGS. 13A, 13B, 13C, so as to travel a distance toward the second set of connectors, but not all the way or at least so the first and second connectors do not mate. Then, the second set of connectors can be actuated, e.g., using the technique described in FIGS. 10A, 10B, so as to travel a distance toward the first set of connectors and so that the first set of connectors mate with the second set of connectors.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

While the foregoing is directed to specific examples, other and further examples may be devised without departing from the basic scope thereof, and the scope thereof is determined by the claims that follow.

What is claimed is:

1. A rack, comprising:

a horizontal tray;

a vertical tray; and an L-shaped cable cartridge comprising: (i) connectors configured to connect to horizontal tray connectors on a first side of the horizontal tray and vertical tray connectors on a second side of the vertical tray that is orthogonal to the first side; and (ii) cables connected to the connectors in the L-shaped cable cartridge to facilitate communication between the horizontal tray and the vertical tray.

2. The rack of claim 1, further comprising:

a plurality of horizontal trays, which includes the horizontal tray, stacked vertically in the rack; and a plurality of vertical trays, which includes the vertical tray, arranged side-by-side in the rack, wherein the connectors of the L-shaped cable cartridge are configured to connect to the horizontal tray connectors on respective first walls of the plurality of horizontal trays and the vertical tray connectors on respective second walls of the plurality of vertical trays that are orthogonal to the respective first walls, and the cables connected to the connectors in the L-shaped cable cartridge facilitate communication between the pluralities of horizontal and vertical trays.

3. The rack of claim 2, further comprising:

a second plurality of horizontal trays disposed below the plurality of vertical trays, while the plurality of horizontal trays is disposed above the plurality of vertical trays, a second L-shaped cable cartridge comprising (i) connectors configured to connect to horizontal tray connectors on respective third walls of the second plurality of horizontal trays and to vertical tray connectors on respective fourth walls of the plurality of vertical trays that are orthogonal to the respective third walls of the second plurality of horizontal trays and (ii) cables connected to the connectors in the second L-shaped cable cartridge to facilitate communication between the second plurality of horizontal trays and the plurality of vertical trays.

4. The rack of claim 3, wherein the respective second walls of the plurality of vertical trays are opposite of the respective fourth walls of the plurality of vertical trays.

5. The rack of claim 2, wherein the plurality of horizontal trays are compute trays and the plurality of vertical trays are switch trays, and wherein the switch trays enable each of the plurality of horizontal trays to communicate with every other tray of the plurality of horizontal trays.

6. The rack of claim 5, wherein each of the plurality of horizontal trays comprises a plurality of graphics processing units, wherein the plurality of vertical trays interconnect the plurality of graphics processing units.

7. The rack of claim 1, wherein the connectors in the L-shaped cable cartridge comprise a first set of connectors that face the first side of the horizontal tray and a second set of connectors that face the second side of the vertical tray, wherein the second set of connectors are configured to actuate to mate with the vertical tray connectors on the second side of the vertical tray.

8. The rack of claim 7, wherein the first set of connectors that face the first side of the horizontal tray are not actuated when mating with the horizontal tray connectors on the first side of the horizontal tray.

9. An L-shaped cable cartridge, comprising:

connectors configured to connect to horizontal tray connectors on a first side of a horizontal tray and to connect to vertical tray connectors on a second side of a vertical tray that is orthogonal to the first side; and cables connected to the connectors in the L-shaped cable cartridge to facilitate communication between the horizontal tray and the vertical tray.

10. The L-shaped cable cartridge of claim 9, wherein the L-shaped cable cartridge has a housing that includes a first portion and a second portion arranged substantially orthogonal to one another, and wherein a first set of the connectors are arranged on the first portion and a second set of the connectors are arranged on the second portion.

11. The L-shaped cable cartridge of claim 10, wherein the first portion of the housing has an internal side and the second portion of the housing has a tray-interface side and a connector-interface side opposing the tray-interface side, the tray-interface side being arranged orthogonal and adjacent to the internal side, and wherein the connectors of the first set are arranged on the internal side and the connectors of the second set are arranged on the connector-interface side.

12. The L-shaped cable cartridge of claim 10, wherein the connectors of the first set are fixed connectors and the connectors of the second set are actuated connectors.

13. The L-shaped cable cartridge of claim 9, wherein the connectors configured to connect to the vertical tray connectors on the second side of the vertical tray are movable along a direction orthogonal to the second side of the vertical tray.

14. The L-shaped cable cartridge of claim 9, wherein the cables travel through a vertically-oriented portion of the L-shaped cable cartridge and a horizontally-oriented portion of the L-shaped cable cartridge.

15. A method comprising:

mounting an L-shaped cable cartridge in a rack;

mounting a horizontal tray in the rack to mate horizontal tray connectors in the horizontal tray with connectors in the L-shaped cable cartridge of a first side of the L-shaped cable cartridge; and mounting a vertical tray in the rack to mate vertical tray connectors in the vertical tray with connectors in a second side of the L-shaped cable cartridge, with the second side being orthogonal to the first side.

16. The method of claim 15, wherein mounting the vertical tray in the rack to mate the vertical tray connectors in the vertical tray with the connectors in the second side of the L-shaped cable cartridge comprises:

sliding the vertical tray into the rack so that the vertical tray connectors in the vertical tray align with the connectors in the second side of the L-shaped cable cartridge; and actuating the connectors in the second side of the L-shaped cable cartridge to mate with the vertical tray connectors in the vertical tray.

17. The method of claim 16, wherein the connectors in the second side of the L-shaped cable cartridge are actuated in series.

18. The method of claim 16, wherein the connectors in the second side of the L-shaped cable cartridge are actuated in parallel.

19. The method of claim 15, wherein the L-shaped cable cartridge is mounted in the rack so that a first set of the connectors in the L-shaped cable cartridge arranged in a vertically-oriented portion of the L-shaped cable cartridge face toward a front side or a rear side of the rack and so that a second set of the connectors in the L-shaped cable cartridge arranged in a horizontally-oriented portion of the L-shaped cable cartridge face toward a top or a bottom of the rack.

20. The method of claim 19, wherein the horizontal tray connectors in the horizontal tray mate with the connectors of the first set and the vertical tray connectors in the vertical tray mate with the connectors of the second set.

* * * * *